United States Patent
Lee et al.

(10) Patent No.: US 12,183,803 B2
(45) Date of Patent: Dec. 31, 2024

(54) GATE STRUCTURES AND SEMICONDUCTOR DEVICES INCLUDING THE SAME

(71) Applicant: SAMSUNG ELECTRONICS CO., LTD., Suwon-si (KR)

(72) Inventors: Jaejin Lee, Goyang-si (KR); Youngjun Kim, Seoul (KR); Hunyoung Bark, Suwon-si (KR); Taekyung Yoon, Hwaseong-si (KR); Eunok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/747,238

(22) Filed: May 18, 2022

(65) Prior Publication Data

US 2023/0063527 A1    Mar. 2, 2023

(30) Foreign Application Priority Data

Aug. 24, 2021    (KR) .................. 10-2021-0111395

(51) Int. Cl.
*H01L 29/49* (2006.01)
*H10B 12/00* (2023.01)

(52) U.S. Cl.
CPC ...... *H01L 29/4966* (2013.01); *H01L 29/4916* (2013.01); *H01L 29/495* (2013.01); *H10B 12/315* (2023.02)

(58) Field of Classification Search
CPC ............. H01L 29/4966; H01L 29/4916; H01L 29/495; H01L 27/108; H01L 27/10897; H01L 2924/1436; H01L 2924/14369; H01L 27/1023; H01L 28/40; H01L 28/92; H10B 12/315; H10B 12/0335; H10B 12/482; H10B 12/488; G11C 11/401; G11C 11/4099; G11C 14/0009; G11C 14/0045; G11C 2211/4016
See application file for complete search history.

(56) References Cited

U.S. PATENT DOCUMENTS

| | | |
|---|---|---|
| 6,281,064 B1 | 8/2001 | Mandelman et al. |
| 10,103,152 B2 | 10/2018 | Kim et al. |
| 10,158,008 B2 | 12/2018 | Koezuka et al. |
| 10,790,287 B2 | 9/2020 | Kang et al. |

(Continued)

FOREIGN PATENT DOCUMENTS

| | | |
|---|---|---|
| TW | 201724181 A | 7/2017 |
| TW | 202111863 A | 3/2021 |

OTHER PUBLICATIONS

Morihide Higo et al., "Surface morphology of metal films deposited on mica at various temperatures observed by atomic force microscopy", Applied Surface Science, vol. 252, Issue 14, May 15, 2006, pp. 5083-5099, doi:10.1016/j.apsusc.2005.07.034.

(Continued)

*Primary Examiner* — Mohammad A Rahman
(74) *Attorney, Agent, or Firm* — Sughrue Mion, PLLC

(57) ABSTRACT

A gate structure includes a first gate electrode including a metal, a gate barrier pattern on the first gate electrode and including a metal nitride, and a second gate electrode on the gate barrier pattern. The gate structure is buried in an upper portion of a substrate. The gate barrier pattern has a flat upper surface and an uneven lower surface.

20 Claims, 25 Drawing Sheets

(56) References Cited

U.S. PATENT DOCUMENTS

| | | |
|---|---|---|
| 10,868,016 B2 | 12/2020 | Im et al. |
| 11,107,826 B2 | 8/2021 | Lee et al. |
| 11,532,698 B2 | 12/2022 | Lin et al. |
| 2014/0212087 A1* | 7/2014 | Cho .................. G02B 6/43 |
| | | 438/31 |
| 2016/0336414 A1 | 11/2016 | Kang |
| 2018/0130805 A1 | 5/2018 | Cho |
| 2019/0027582 A1* | 1/2019 | Lee .................. H01L 29/4983 |
| 2019/0393225 A1* | 12/2019 | Im .................... H10B 12/34 |
| 2020/0105765 A1 | 4/2020 | Kim et al. |
| 2020/0152754 A1 | 5/2020 | Kim et al. |
| 2020/0286530 A1* | 9/2020 | Lee .................. G11C 16/0483 |
| 2020/0312852 A1 | 10/2020 | Ryu et al. |
| 2021/0074805 A1* | 3/2021 | Lin .................... H01L 23/5223 |
| 2021/0082767 A1 | 3/2021 | Kim et al. |
| 2021/0134975 A1 | 5/2021 | Umezawa et al. |

OTHER PUBLICATIONS

Communication issued on May 2, 2023 by the Taiwan Intellectual Property Office for Taiwanese Patent Application No. 111120354.
Communication issued on Sep. 30, 2024 by the Taiwan Intellectual Property Office for Taiwanese Patent Application No. 111120354.

* cited by examiner

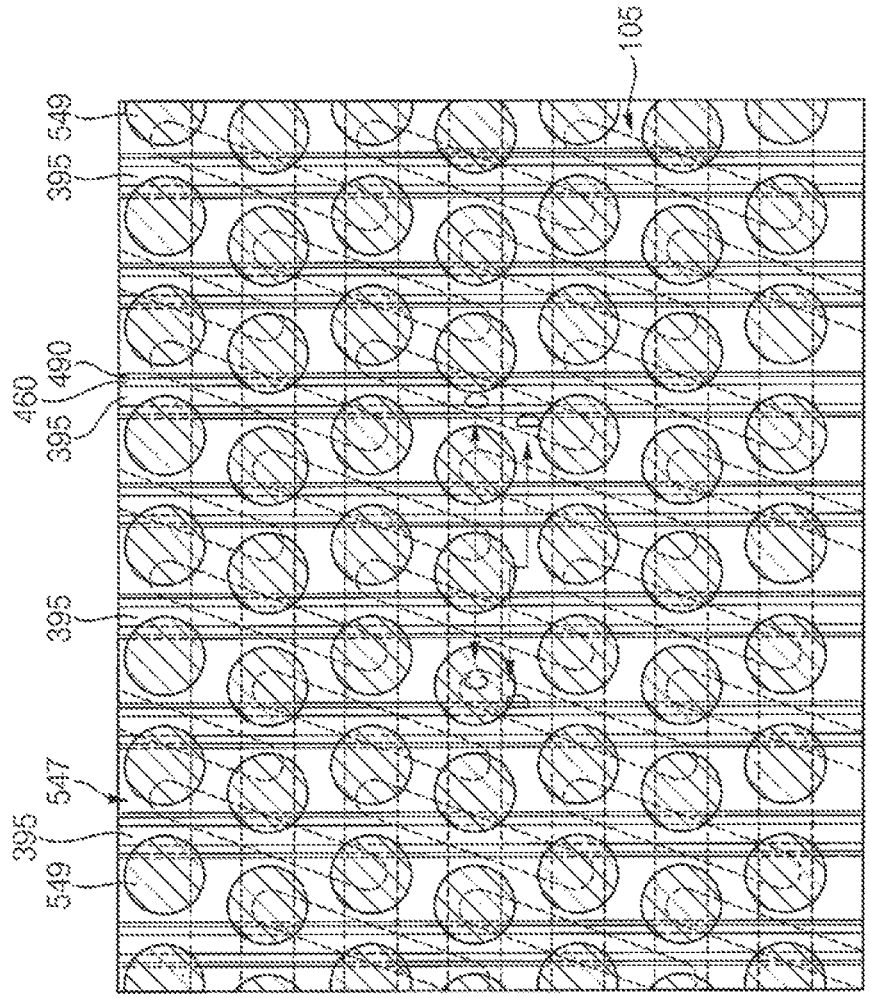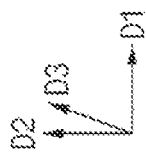

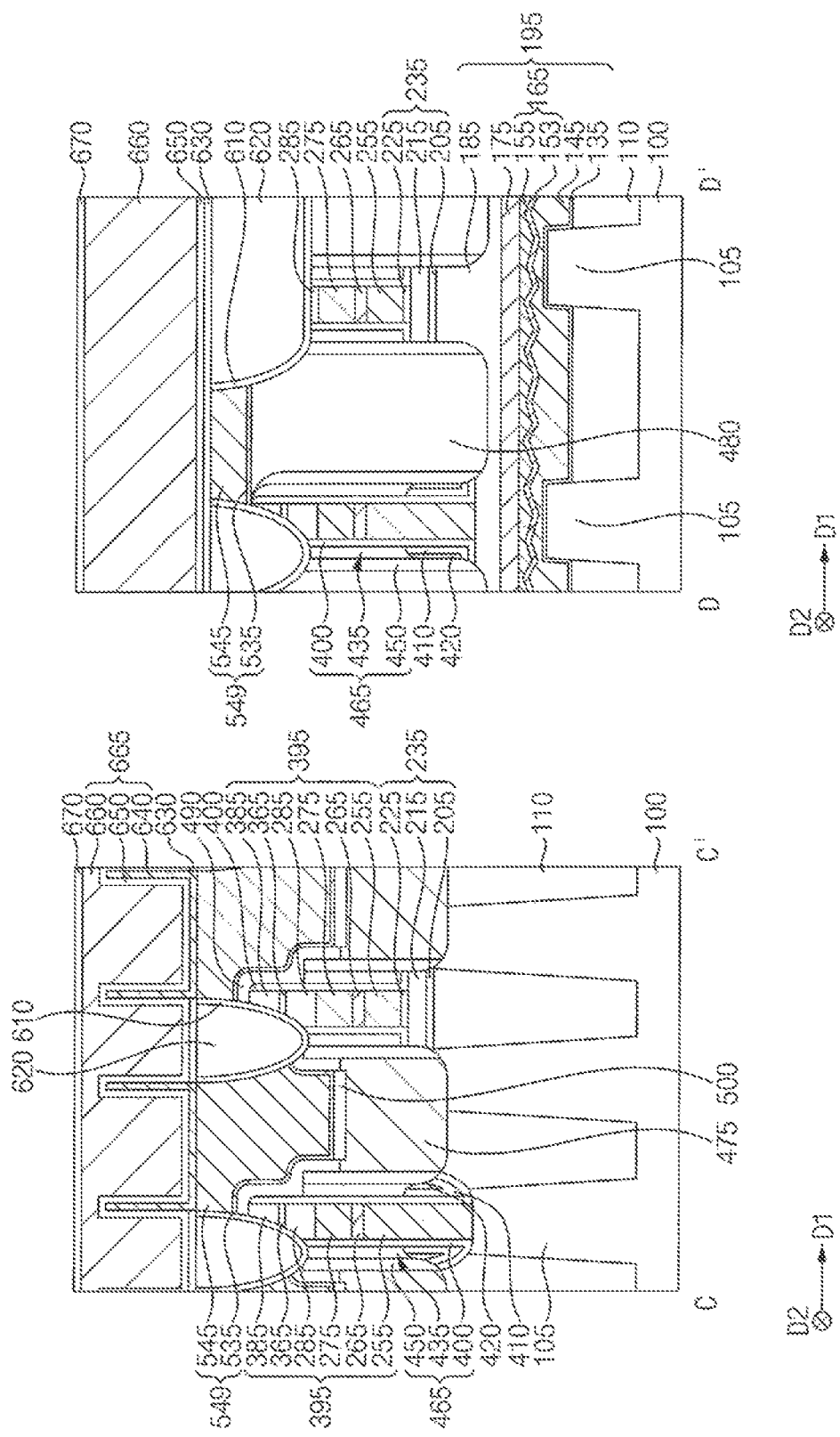

GATE STRUCTURES AND SEMICONDUCTOR DEVICES INCLUDING THE SAME

CROSS-REFERENCE TO RELATED APPLICATION

This application claims priority under 35 U.S.C. § 119 to Korean Patent Application No. 10-2021-0111395 filed on Aug. 24, 2021 in the Korean Intellectual Property Office, the disclosure of which is hereby incorporated by reference in its entirety.

BACKGROUND

Example embodiments of the present disclosure relate to a gate structure and a semiconductor device including the same.

In a DRAM device, a buried gate structure may be formed by forming a recess on a substrate and sequentially forming first and second gate electrodes and a gate mask in the recess. Materials of the first and second gate electrodes may be diffused into each other.

SUMMARY

It is an aspect to provide a gate structure having improved characteristics.

It is another aspect to provide a semiconductor device including a gate structure having improved characteristics.

According to various aspects of one or more example embodiments, there is provided a gate structure. The gate structure may include a first gate electrode including a metal, a gate barrier pattern on the first gate electrode and including a metal nitride, and a second gate electrode on the gate barrier pattern. The gate structure may be buried in an upper portion of a substrate. The gate barrier pattern may have a flat upper surface and an uneven lower surface.

According to various aspects of one or more example embodiments, there is provided a gate structure. The gate structure may include a first gate electrode, a gate barrier pattern structure on the first gate electrode, the gate barrier pattern structure including a first gate barrier pattern including a first material and a second gate barrier pattern including a second material different from the first material, and a second gate electrode on the gate barrier pattern structure. The gate structure may be buried in an upper portion of a substrate. The gate barrier pattern structure may have a flat upper surface and an uneven lower surface.

According to various aspects of one or more example embodiments, there is provided a semiconductor device. The semiconductor device may include an active pattern on a substrate, an isolation pattern covering a sidewall of the active pattern, a gate structure buried in upper portions of the active pattern and the isolation pattern and extending in a first direction parallel to an upper surface of the substrate, a bit line structure contacting a central upper surface of the active pattern and extending in a second direction parallel to the upper surface of the substrate and perpendicular to the first direction, a contact plug structure contacting an upper surface of each of opposite ends of the active pattern, and a capacitor on the contact plug structure. The gate structure may include a first gate electrode extending in the first direction and including a metal, a gate barrier pattern structure on the first gate electrode and including a metal nitride, and a second gate electrode on the gate barrier pattern structure. The gate barrier pattern structure may have a flat upper surface and an uneven lower surface.

BRIEF DESCRIPTION OF THE DRAWINGS

The above and other aspects will become readily understood from the detail descriptions that follow, with reference to the accompanying drawings, in which:

FIGS. 10 to 24 are plan views and cross-sectional views illustrating a method of manufacturing a semiconductor device in accordance with example embodiments; and FIG. 25 is a cross-sectional view illustrating a semiconductor device in accordance with example embodiments.

DETAILED DESCRIPTION

It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer or section. Thus, a "first" element, component, region, layer or section discussed below could be termed a "second" or a "third" element, component, region, layer or section without departing from the teachings of the specification.

Hereinafter, in the specification (and not necessarily in the claims), two directions substantially parallel to an upper surface of a substrate and substantially perpendicular to each other may be referred to as a first direction D1 and a second direction D2, respectively, and a direction substantially parallel to the upper surface of the substrate and having an acute angle with respect to the first and second directions D1 and D2 may be referred to as a third direction D3.

The gate structure in accordance with various example embodiments may include the gate barrier pattern between the first and second gate electrodes, and the diffusion between the materials included in the first and second gate electrodes may be prevented. Thus, the gate structure may have enhanced electrical characteristics.

Additionally, in the method of forming the gate structure, the processes of forming the first gate electrode and the gate barrier pattern may be simplified, and thus the process margin for forming the gate structure may be enhanced.

Figure 1:
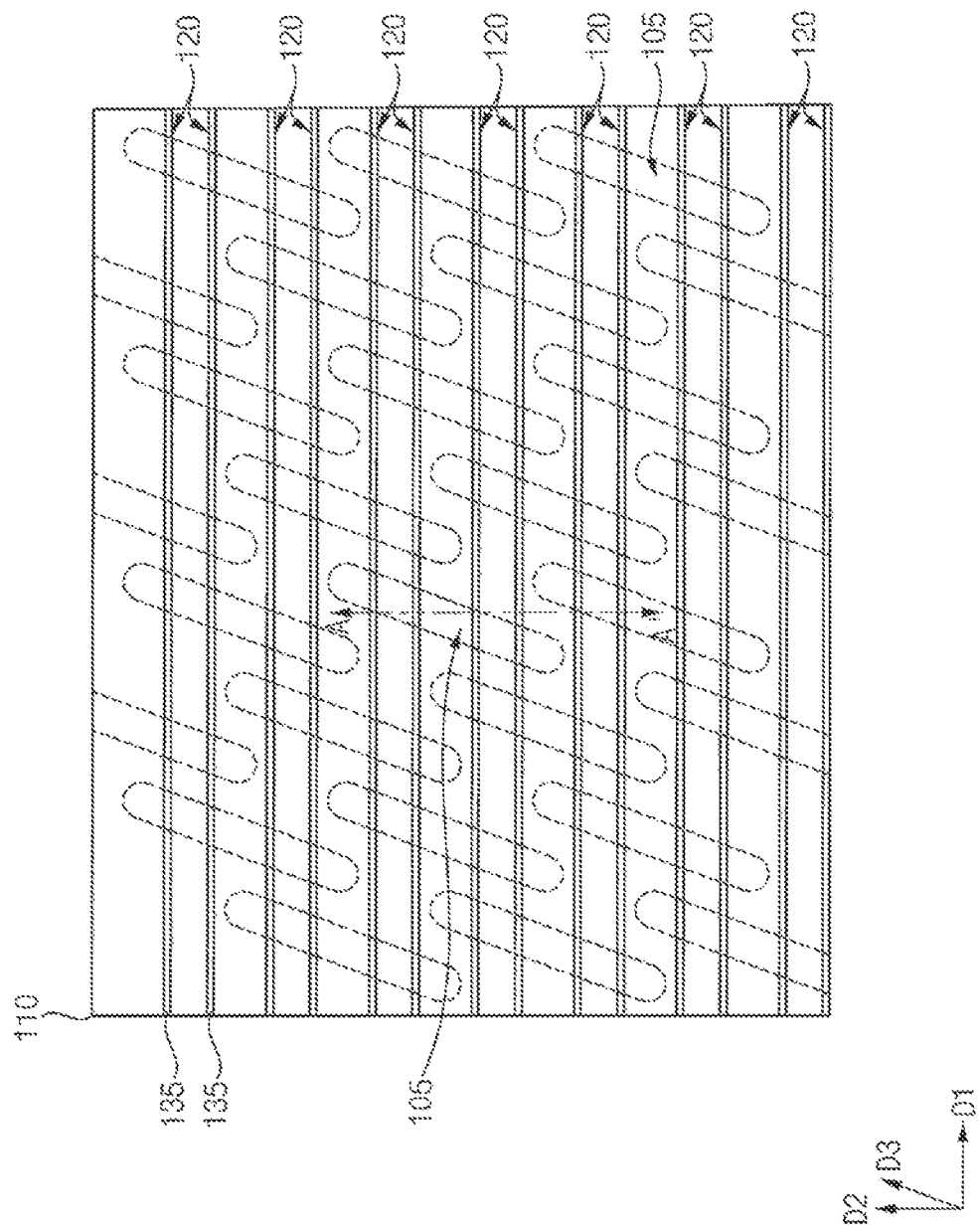
FIGS. 1 to 7 are plan views and cross-sectional views illustrating a method of forming a gate structure in accordance with example embodiments.
Figure 2:
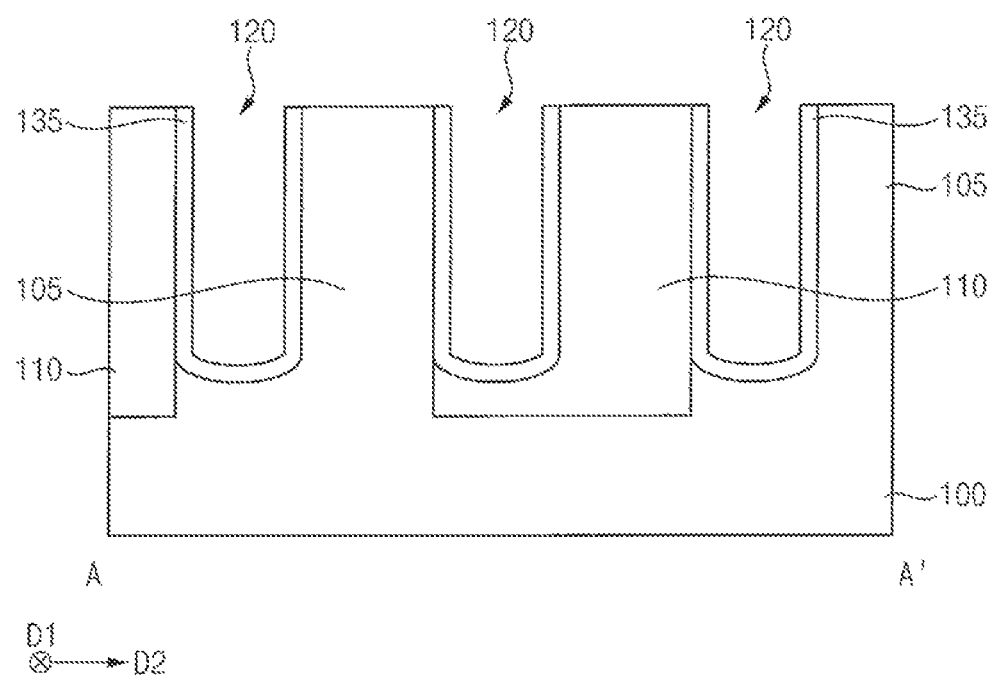
Figure 3:
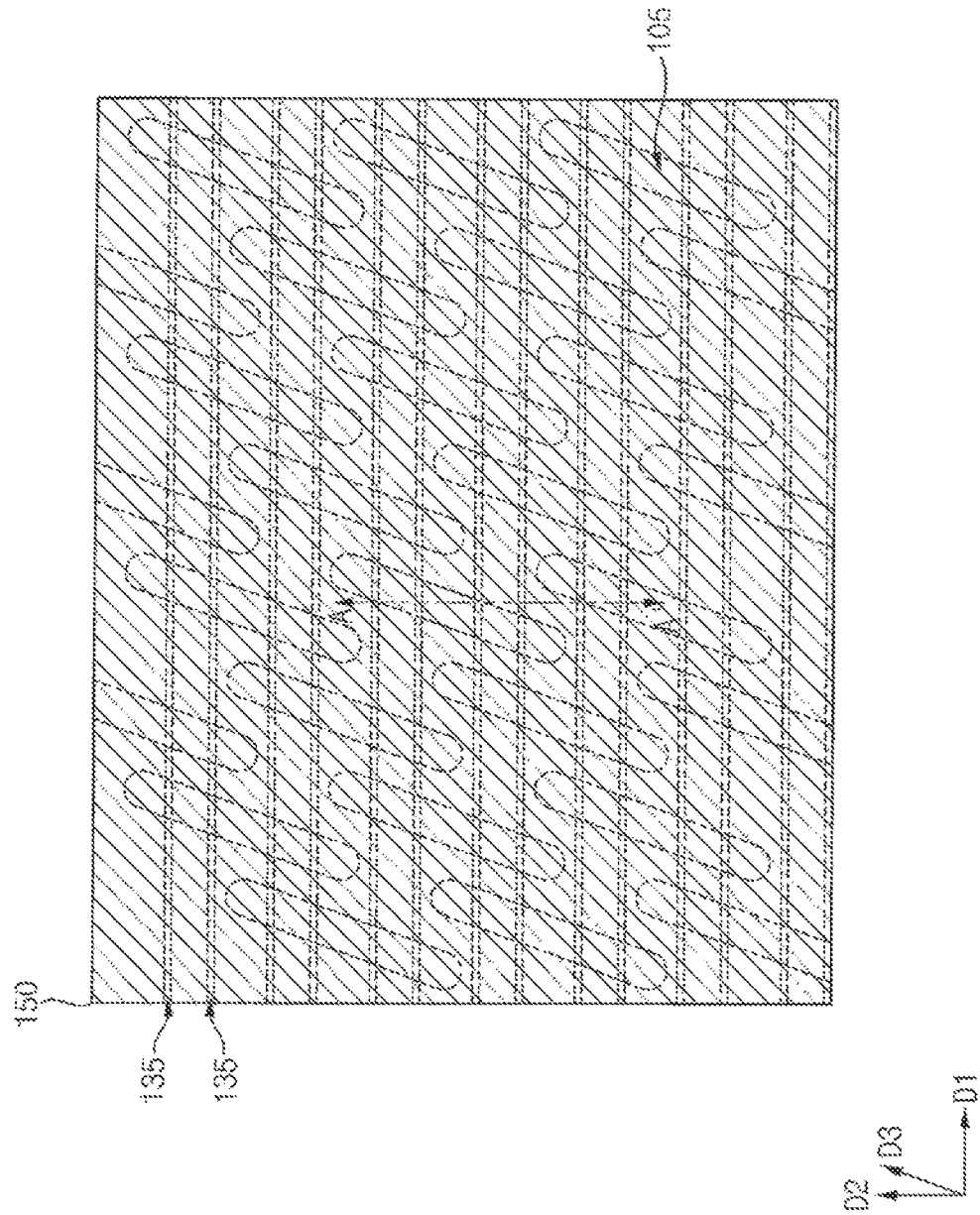
Figure 4:
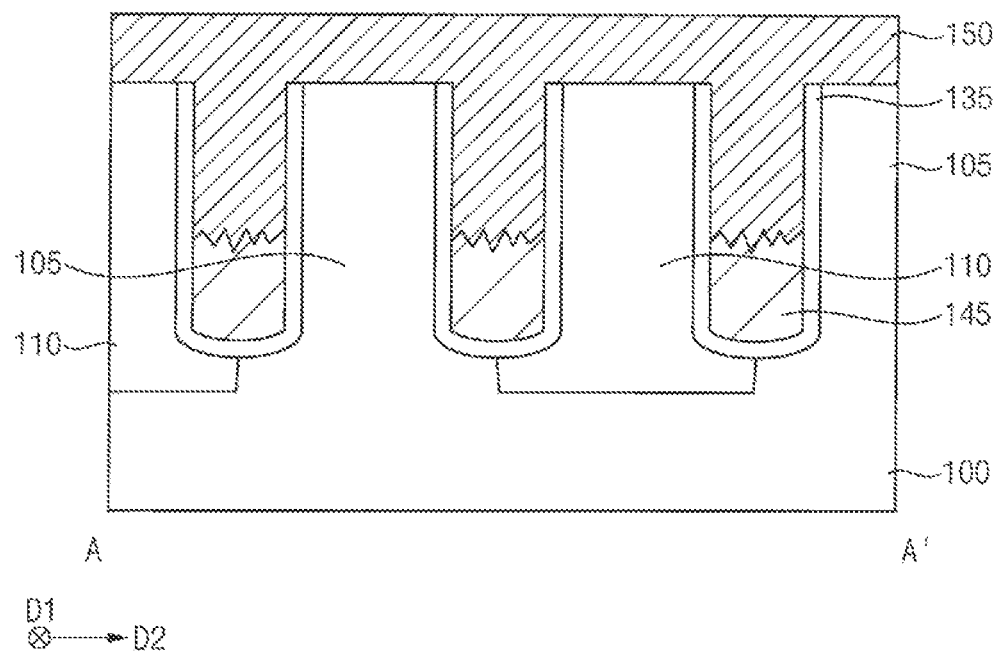
Figure 5:
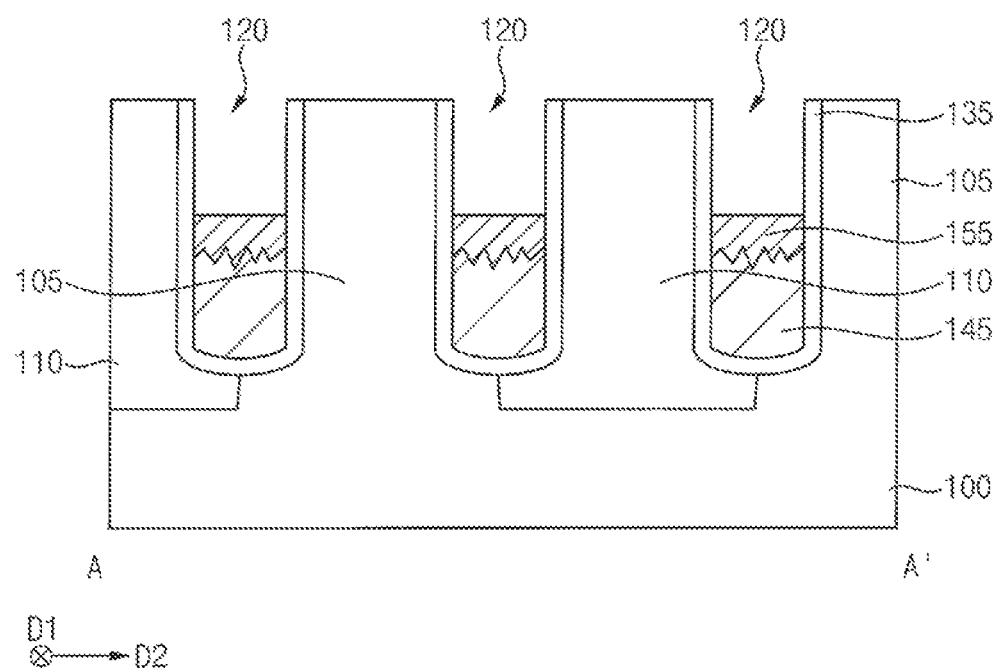
Figure 6:
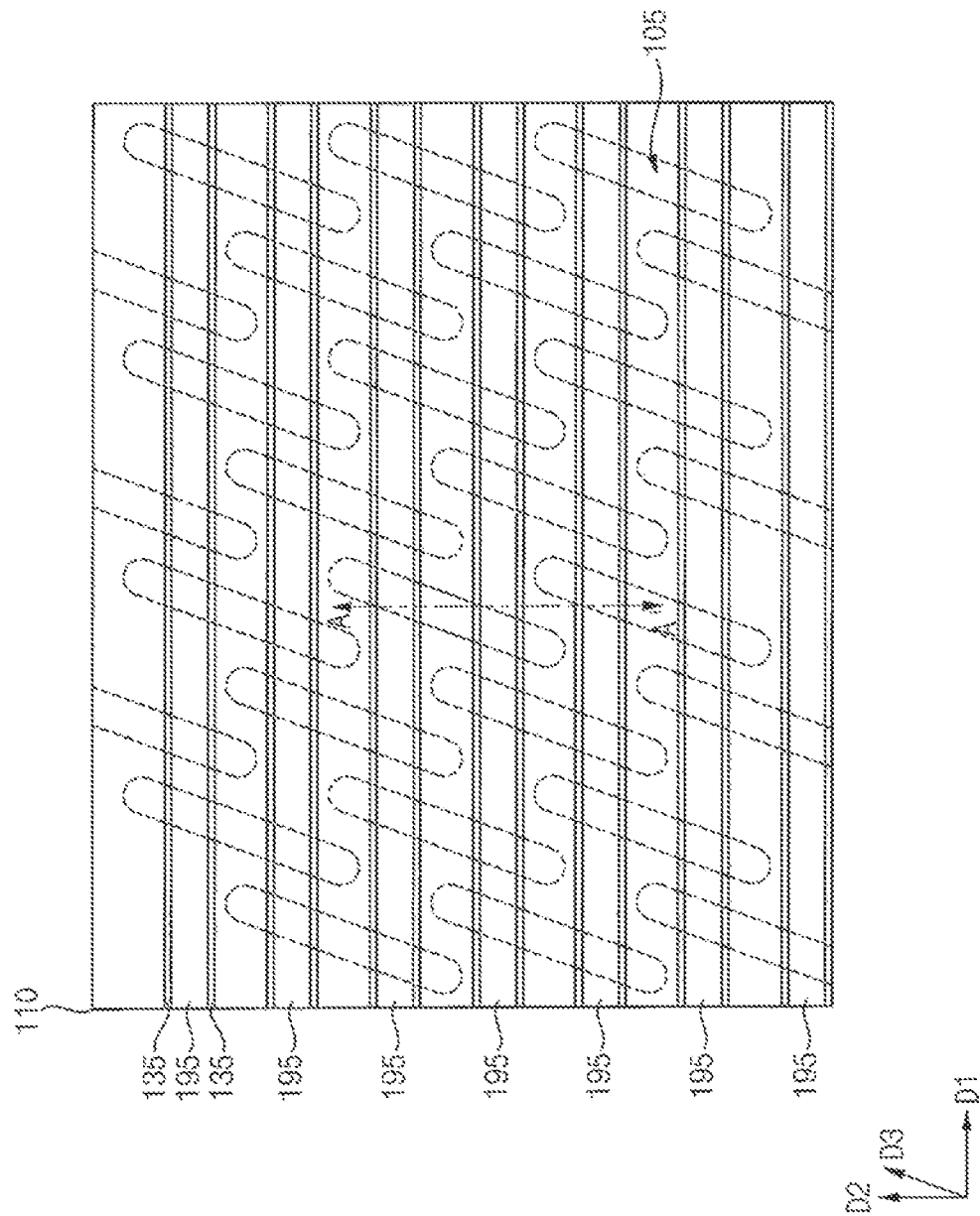

FIGS. 1 to 7 are plan views and cross-sectional views illustrating a method of forming a gate structure in accordance with example embodiments. Particularly, FIGS. 1, 3 and 6 are plan views, and FIGS. 2, 4-5 and 7 are cross-sectional views taken along A-A' lines of corresponding plan views, respectively.

Referring to FIGS. 1 and 2, an active pattern 105 may be formed on a substrate 100, and an isolation pattern 110 may be formed to cover a sidewall of the active pattern 105.

The substrate 100 may include silicon, germanium, silicon-germanium, or a III-V group compound semiconductor, such as GaP, GaAs, or GaSb. In example embodiments, the substrate 100 may be a silicon-on-insulator (SOI) substrate or a germanium-on-insulator (GOI) substrate.

The active pattern 105 may be formed by removing an upper portion of the substrate 100 to form a first recess, and a plurality of active patterns 105 may be formed to be spaced apart from each other in each of the first and second directions D1 and D2 (best seen in FIG. 1). Each of the plurality of active patterns 105 may extend in the third direction D3.

The isolation pattern 110 may include an oxide, e.g., silicon oxide.

An etching mask including, e.g., an amorphous carbon layer (ACL) or a spin-on-hardmask (SOH) may be formed on the active pattern 105 and the isolation pattern 110, and the active pattern 105 and the isolation pattern 110 may be partially etched using the etching mask to form a second recess 120 extending in the first direction D1. In example embodiments, a plurality of second recesses 120 may be spaced apart from each other in the second direction D2.

The etching mask may be removed by, e.g., an ashing process and/or a stripping process, and the active pattern 105 and the isolation pattern 110 may be exposed.

A gate insulation pattern 135 may be conformally formed on an inner wall of the second recess 120. The gate insulation pattern 135 may include an oxide, e.g., silicon oxide.

In an example embodiment, the gate insulation pattern 135 may be formed by performing a thermal oxidation process on the active pattern 105 and the isolation pattern 110 exposed by the second recess 120.

Referring to FIGS. 3 and 4, a first gate electrode 145 may be formed to fill a lower portion of the second recess 120, and a first gate barrier layer 150 may be formed to fill an upper portion of the second recess 120. The first gate barrier layer 150 may also be formed on the active pattern 105 and the isolation pattern 110.

The first gate electrode 145 may be formed by performing a first deposition process including a first chemical vapor deposition (CVD) process and/or a first atomic layer deposition (ALD) process to form a first gate electrode layer in the second recess 120, and performing a purge process on the first gate electrode layer to remove an upper portion of the first gate electrode layer. In other words, an upper portion of the first gate electrode layer in the second recess 120 may be removed by the purging process. In some example embodiments, a portion of the first gate electrode layer that is formed on the active pattern 105 and the isolation pattern 110 may be removed by the purging process. Thus, the first gate electrode 145 may have an uneven upper surface.

The first gate barrier layer 150 may be formed by performing a second deposition process including a second CVD process and/or a second ALD process to fill the second recess 120, and may also be formed on the active pattern 105 and the isolation pattern 110. Thus, the first gate barrier layer 150 may have an uneven lower surface.

In example embodiments, the first deposition process, the purge process and the second deposition process may be performed in-situ.

The first gate electrode 145 may include a metal, e.g., tungsten, molybdenum, tantalum, titanium, etc., and the first gate barrier layer 150 may include a metal nitride, e.g., tungsten nitride, molybdenum nitride, tantalum nitride, titanium nitride, etc.

In an example embodiment, the first and second deposition processes may be performed using a source gas and/or a precursor including the same metal, and thus the first gate electrode 145 and the first gate barrier layer 150 may include the same metal.

In other example embodiments, the first and second deposition processes may be performed using a source gas and/or a precursor including different metals, and thus the first gate electrode 145 and the first gate barrier layer 150 may include different metals. That is, in the other example embodiments, the source gas and/or the precursor may include different metals in the first and second deposition processes, respectively, and thus the first gate electrode 145 and the first gate barrier layer 150 may include different metals.

Referring to FIG. 5, an upper portion of the first gate barrier layer 150 may be removed by, e.g., an etch back process so that a first gate barrier pattern 155 having a flat upper surface may be formed. The first gate barrier pattern 155 may have the flat upper surface and the uneven lower surface, and thus a thickness of the first gate barrier pattern 155 may not be uniform.

Figure 7:
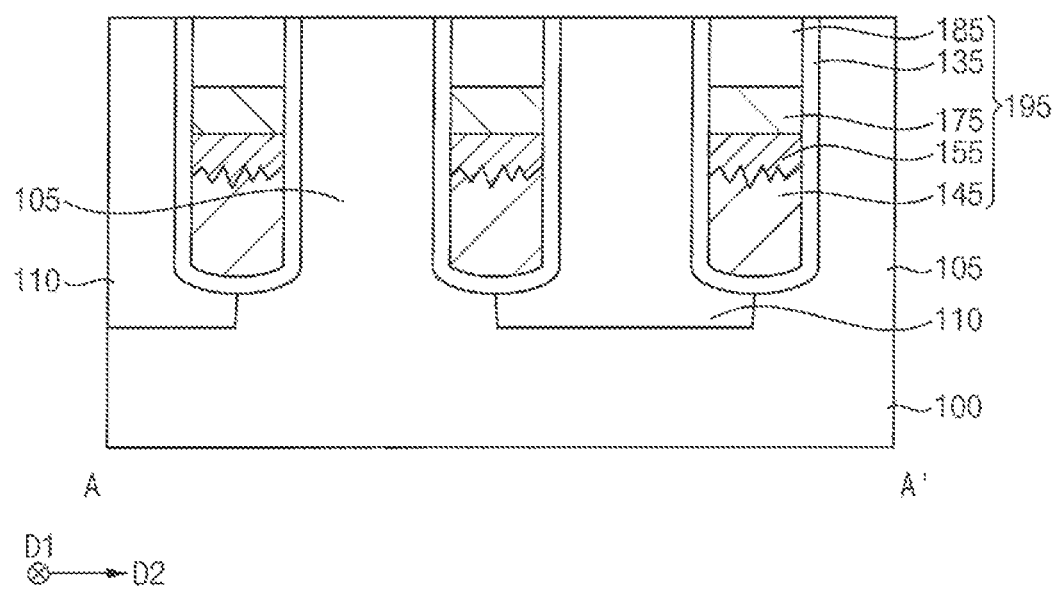

Referring to FIGS. 6 and 7, a second gate electrode 175 and a gate mask 185 may be sequentially formed in the second recess 120, so that a gate structure 195 may be formed.

The second gate electrode 175 may be formed on the first gate barrier pattern 155, and a gate mask layer may be formed on the active pattern 105, the isolation pattern 110 and the gate insulation pattern 135 to fill an upper portion of the second recess 130, and the gate mask layer may be planarized until an upper surface of the active pattern 105 is exposed, to form the gate mask 185 in the second recess 120.

The second gate electrode 175 may include, e.g., doped polysilicon, and the gate mask 185 may include a nitride, e.g., silicon nitride.

If, as in the related art, the first gate electrode layer is formed to fill the second recess 120 by the first deposition process, the upper portion of the first gate electrode layer is removed by the etch back process to form the first gate electrode 145, and an annealing process and a nitridation process are performed on the upper portion of the first gate electrode 145 to form the first gate barrier pattern 155, a process margin for forming the gate structure 195 may be low. Additionally, both the upper surface of the first gate electrode 145 and the lower surface of the first gate barrier pattern 155 may be flat, and the first gate electrode 145 and the first gate barrier pattern 155 may include different metals.

However, in example embodiments, the first deposition process, the purge process and the second deposition process may be performed in-situ to form the first gate electrode 145 and the first gate barrier layer 150, and the etch back process may be performed on the upper portion of the first gate barrier layer 150 to form the first gate barrier pattern 155. That is, the first deposition process, the purge process and the second deposition process may be performed in-situ, so that the annealing process and the nitridation process may be omitted, and thus a process margin for forming the gate structure 195 may be enhanced. Additionally, both the upper surface of the first gate electrode 145 and the lower surface of the first gate barrier pattern 155 may not be flat, and the first gate electrode 145 and the first gate barrier pattern 155 may include different metals.

The gate structure 195 manufactured by the above processes may include the first gate electrode 145, the first gate barrier pattern 155, the second gate electrode 175 and the gate mask 185 sequentially stacked and buried in the upper portion of the substrate 100. Additionally, the gate structure 195 may include the gate insulation pattern 135 covering the lower surface and a sidewall of the first gate electrode 145 and sidewalls of the first gate barrier pattern 155, the second gate electrode 175 and the gate mask 185.

In example embodiments, the gate structure 195 may extend in the first direction D1, and a plurality of gate structures 195 may be spaced apart from each other in the second direction D2.

As illustrated above, the first gate barrier pattern 155 may be formed between the first and second gate electrodes 145 and 175, and thus a diffusion between a metal of the first gate electrode 145 and a metal nitride of the second gate electrode 175 may be prevented. Accordingly, the electrical characteristics of the gate structure 195 may be enhanced.

Figure 8:
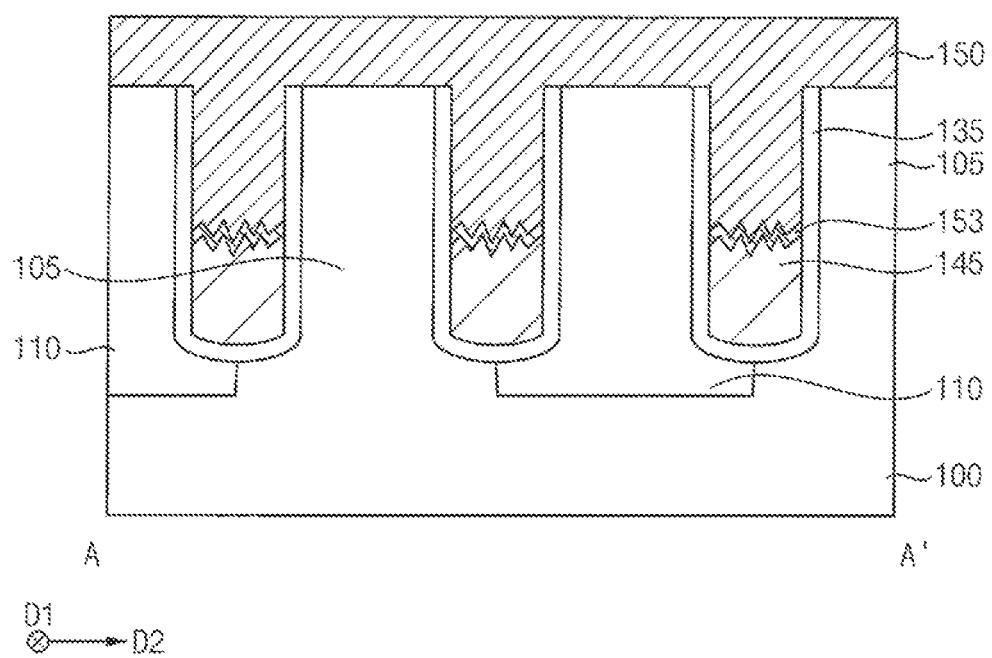
FIGS. 8 and 9 are cross-sectional views illustrating a method of forming a gate structure in accordance with example embodiments.
Figure 9:
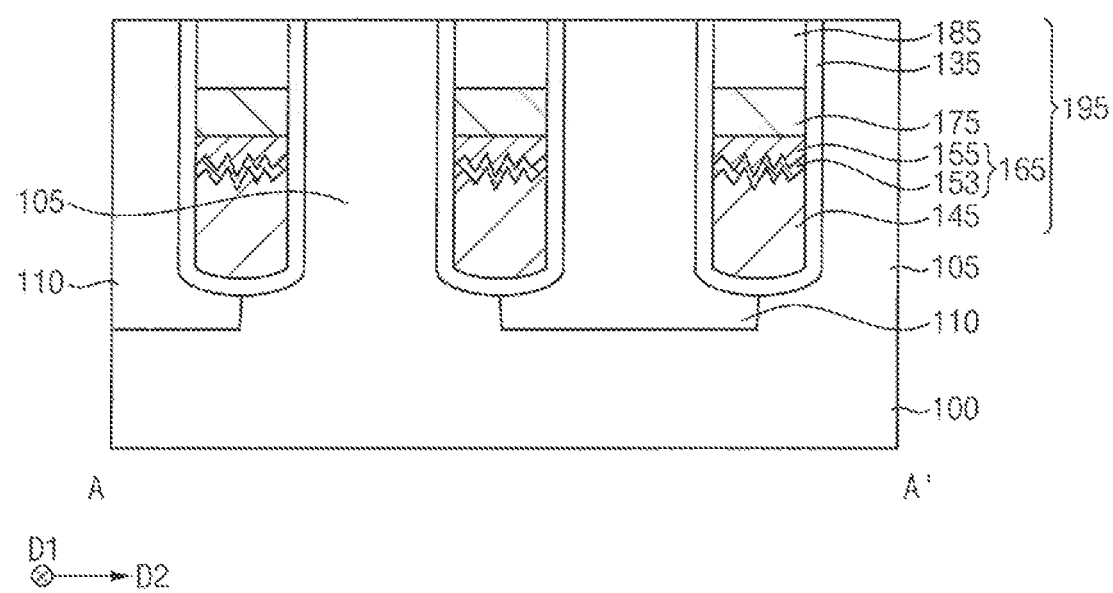

FIGS. 8 and 9 are cross-sectional views illustrating a method of forming a gate structure in accordance with example embodiments. The method illustrated in FIGS. 8-9 may include processes substantially the same as or similar to those illustrated with reference to FIGS. 1 to 7, and thus repeated explanations thereon are omitted herein for conciseness.

Referring to FIG. 8, the first gate electrode 145 may be formed to fill the lower portion of the second recess 120, a second gate barrier pattern 153 may be formed on the first gate electrode 145, and the first gate barrier layer 150 may be formed to fill the upper portion of the second recess 120. The first gate barrier layer 150 may also be formed on the active pattern 105 and the isolation pattern 110.

The second gate barrier pattern 153 may be formed by a third deposition process including a third CVD process and/or a third ALD process. Thus, the second gate barrier pattern 153 may have uneven upper and lower surfaces.

The first gate barrier layer 150 may be formed by the second deposition process including the second CVD process and/or the second ALD process, and may also be formed on the active pattern 105 and the isolation pattern 110. Thus, the first gate barrier layer 150 may have the uneven lower surface.

In example embodiments, the first deposition process, the purge process, the third deposition process and the second deposition process may be performed in-situ.

The second gate barrier pattern 153 may include a metal oxynitride, e.g., tungsten oxynitride, molybdenum oxynitride, tantalum oxynitride, titanium oxynitride, etc., and the first gate barrier layer 150 may include a metal nitride, e.g., tungsten nitride, molybdenum nitride, tantalum nitride, titanium nitride, etc.

In an example embodiment, the first to third deposition processes may be performed using a source gas and/or a precursor including the same metal, and thus the first gate electrode 145, the second gate barrier pattern 153 and the first gate barrier layer 150 may include the same metal.

In another example embodiment, the second and third deposition processes may be performed using a source gas and/or a precursor including the same metal. However, the first deposition process may be performed using a source gas and/or a precursor including a metal different from the metal included in the source gas and/or the precursor used in the second and third deposition processes. Thus, the second gate barrier pattern 153 and the first gate barrier layer 150 may include the same metal, but the first gate electrode 145 may include a metal different from that of the second gate barrier pattern 153 and the first gate barrier layer 150.

Referring to FIG. 9, the upper portion of the first gate barrier layer 150 may be removed by, e.g., an etch back process to form the first gate barrier pattern 155 having the flat upper surface. The first gate barrier pattern 155 may have the flat upper surface and the uneven lower surface, and thus the thickness of the first gate barrier pattern 155 may not be uniform.

The first and second gate barrier patterns 155 and 153 may have a gate barrier pattern structure 165. That is, the gate barrier pattern structure 165 may include the first and second gate barrier patterns 155 and 153, as shown in FIG. 9. The gate barrier pattern structure 165 may have a flat upper surface and an uneven lower surface, and thus a thickness of the gate barrier pattern structure 165 may not be uniform.

The second gate electrode 175 and the gate mask 185 may be sequentially formed to fill the second recess 120, so that the gate structure 195 may be formed in the second recess 120.

The gate structure 195 may include the gate insulation pattern 135, the first gate electrode 145, the gate barrier pattern structure 165, the second gate electrode 175 and the gate mask 185.

As illustrated above, the first deposition process, the purge process, the third deposition process and the second deposition process may be performed in-situ, and a process margin for forming the gate structure 195 may be enhanced. Additionally, the upper surface of the first gate electrode 145 and the lower surface of the gate barrier pattern structure 165 may not be flat, and the first gate electrode 145 and the gate barrier pattern 165 may include different metals from each other.

The gate structure 195 manufactured by the above processes illustrated with respect to FIGS. 1-9 may include the first gate electrode 145, the gate barrier pattern structure 165, the second gate electrode 175 and the gate mask 185 sequentially stacked and buried in the upper portion of the substrate 100. Additionally, the gate structure 195 may include the gate insulation pattern 135 covering the lower surface and a sidewall of the first gate electrode 145 and sidewalls of the gate barrier pattern structure 165, the second gate electrode 175 and the gate mask 185.

As illustrated above, the gate barrier pattern structure 165 may be formed between the first and second gate electrodes 145 and 175, and thus a diffusion between a metal of the first gate electrode 145 and a metal nitride of the second gate electrode 175 may be prevented. Accordingly, the electrical characteristics of the gate structure 195 may be enhanced.

FIGS. 10 to 24 are plan views and cross-sectional views illustrating a method of manufacturing a semiconductor device in accordance with example embodiments. Particularly, FIGS. 10, 13, 17, 20 and 22 are the plan views, and each of FIGS. 11-12, 14-16, 18-19 and 23-24 includes cross-sections taken along lines C-C' and D-D' of a corresponding plan view.

This method of manufacturing the semiconductor device is the application of the method of forming the gate structure illustrated with reference to FIGS. 1 to 7 to a method of manufacturing a DRAM device as an example. Thus, repeated explanations on the formation of the gate structure are omitted herein for conciseness.

Figure 10:
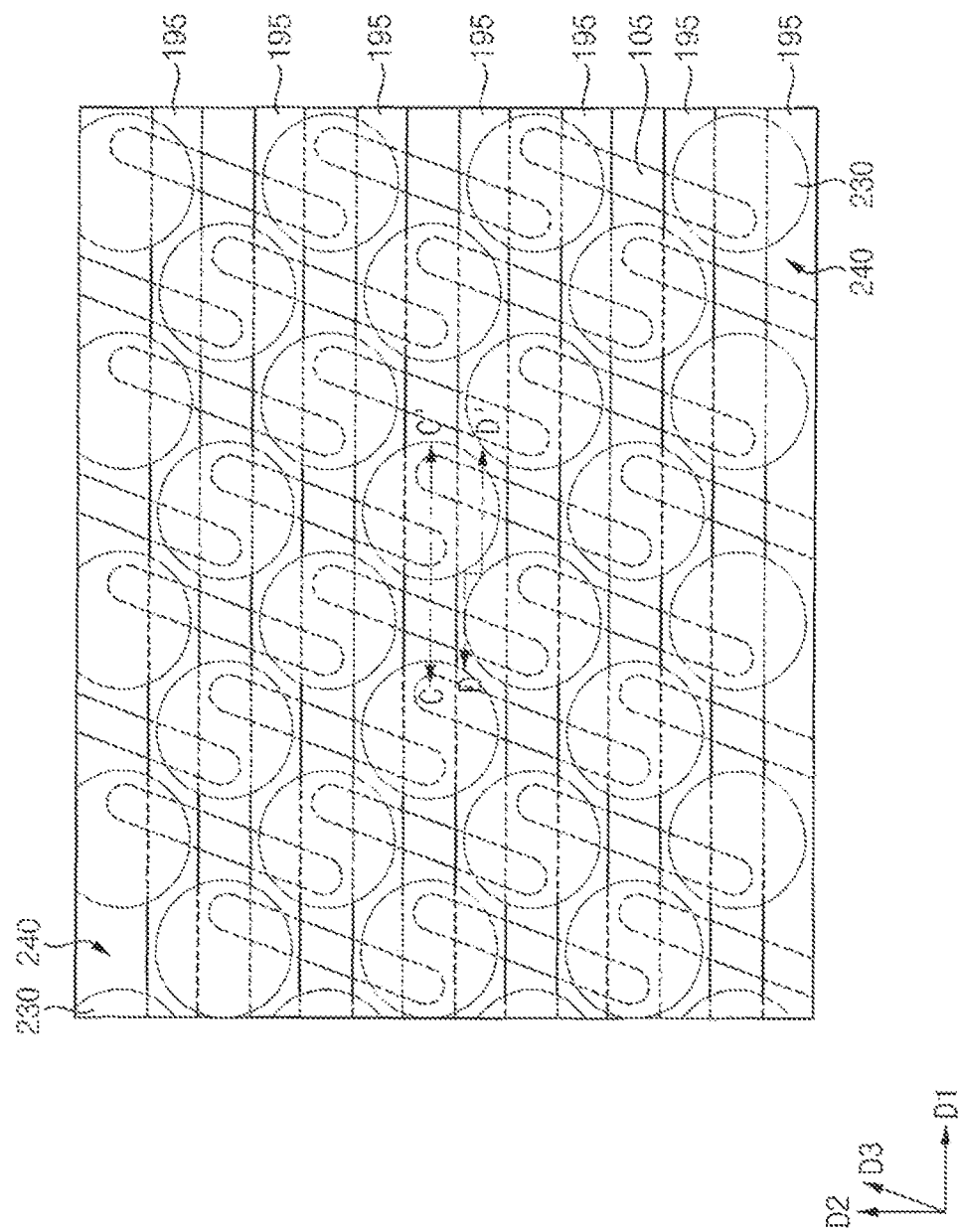
Figure 11:
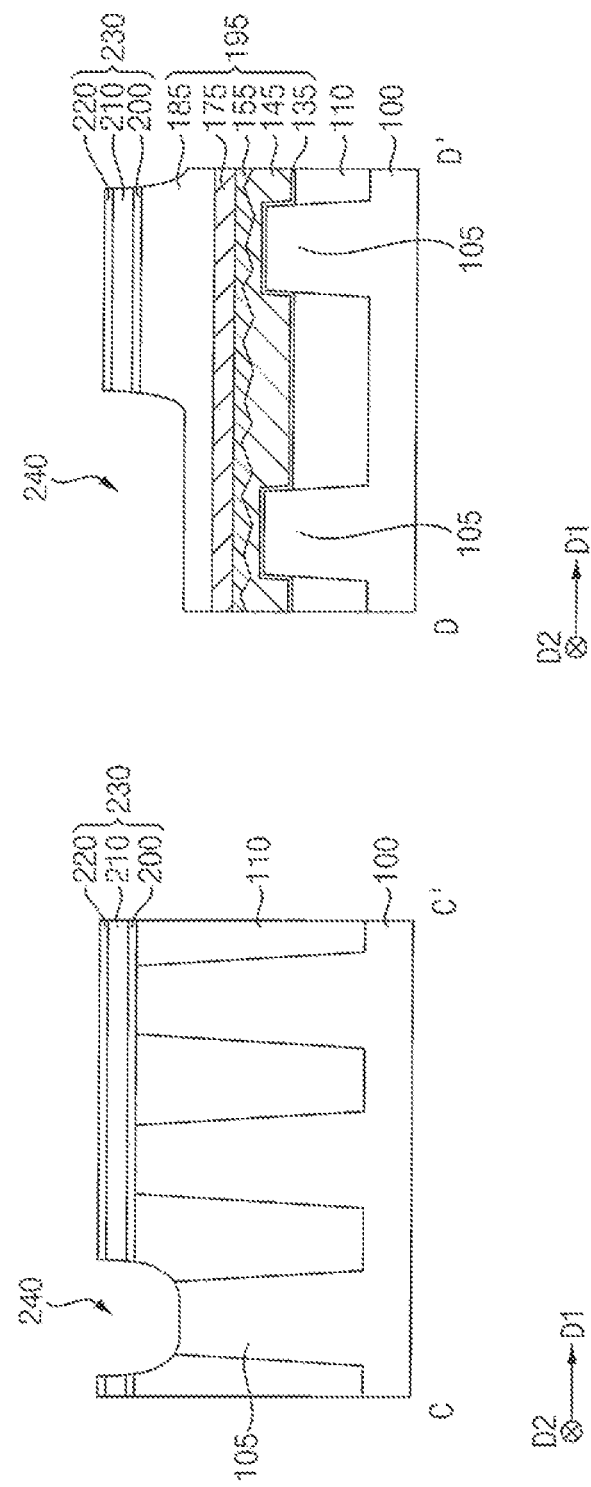

Referring to FIGS. 10 and 11, processes substantially the same as or similar to those illustrated with reference to FIGS. 1 to 7 may be performed to form the gate structure 195.

An insulation layer structure 230 may be formed on the active pattern 105, the isolation pattern 110 and the gate structure 195. The insulation layer structure 230 may include a first insulation layer 200, a second insulation layer 210, and a third insulation layer 220 sequentially stacked. The first and third insulation layers 200 and 220 may include an oxide, e.g., silicon oxide, and the second insulation layer 210 may include a nitride, e.g., silicon nitride.

The insulation layer structure 230 may be patterned, and the active pattern 105, the isolation pattern 110 and the gate mask 185 included in the gate structure 195 may be partially etched using the patterned insulation layer structure 230 as an etching mask to form a first opening 240. In example embodiments, the insulation layer structure 230 remaining after the etching process may have a shape of a circle or ellipse in a plan view, and a plurality of insulation layer structures 230 may be spaced apart from each other in the first and second directions D1 and D2. Each of the insulation layer structures 230 may overlap ends in the third direction D3 of neighboring ones of the active patterns 105 in a vertical direction substantially perpendicular to an upper surface of the substrate 100.

Figure 12:
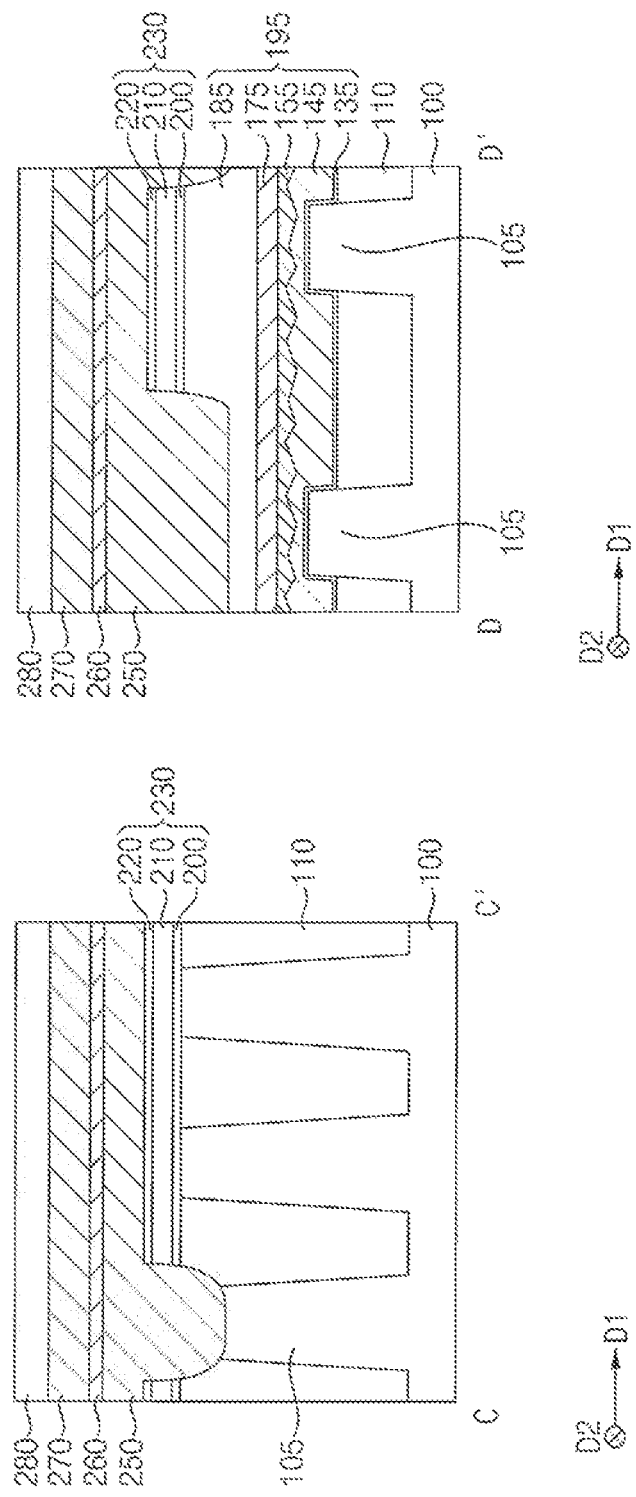

Referring to FIG. 12, a first conductive layer 250, a first barrier layer 260, a second conductive layer 270 and a first mask layer 280 may be sequentially stacked on the insulation layer structure 230, and the active pattern 105, the isolation pattern 110 and the gate structure 195 exposed by the first opening 240, which may form a conductive layer structure. The first conductive layer 250 may fill the first opening 240.

The first conductive layer 250 may include, e.g., doped polysilicon, the first barrier layer 260 may include a metal silicon nitride, e.g., titanium silicon nitride, the second conductive layer 270 may include a metal, e.g., tungsten, and the first mask layer 280 may include a nitride, e.g., silicon nitride.

Figure 13:
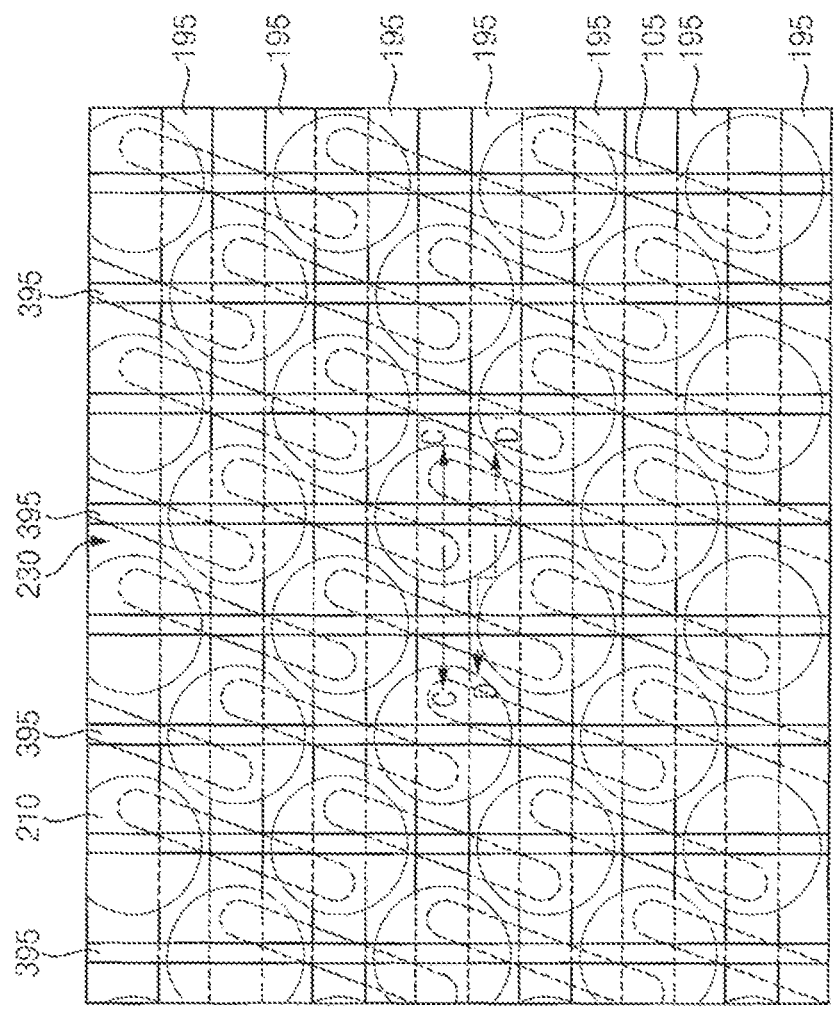
Figure 14:
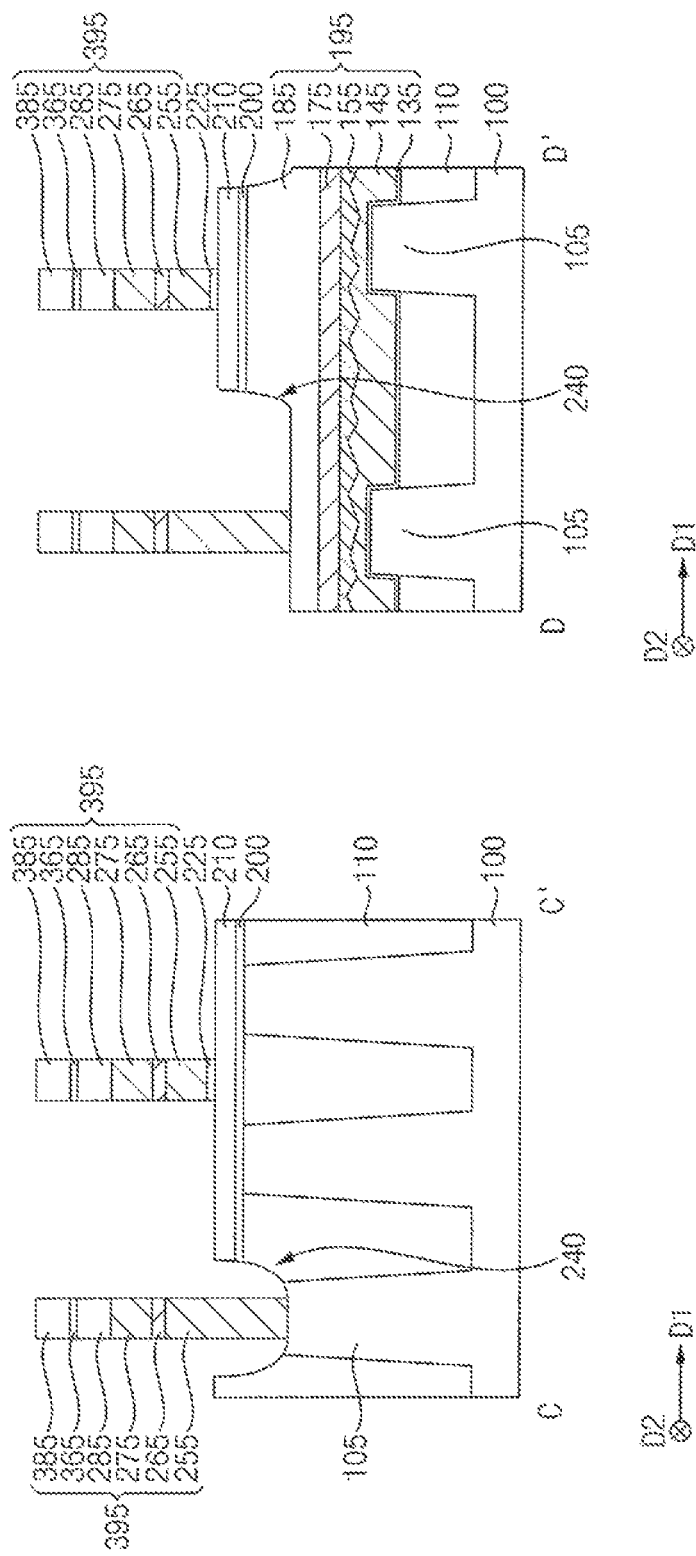

Referring to FIGS. 13 and 14, a first etch stop layer and a first capping layer may be sequentially stacked on the conductive layer structure, the first capping layer may be etched to form a first capping pattern 385, and the first etch stop layer, the first mask layer 280, the second conductive layer 270, the first barrier layer 260 and the first conductive layer 250 may be sequentially etched using the first capping pattern 385 as an etching mask.

In example embodiments, the first capping pattern 385 may extend in the second direction D2, and a plurality of first capping patterns 385 may be spaced apart from each other in the first direction D1.

By the etching process, a first conductive pattern 255, a first barrier pattern 265, a second conductive pattern 275, a first mask 285, a first etch stop pattern 365 and the first capping pattern 385 may be sequentially stacked on the first opening 240, and a third insulation pattern 225, the first conductive pattern 255, the first barrier pattern 265, the second conductive pattern 275, the first mask 285, the first etch stop pattern 365 and the first capping pattern 385 may be sequentially stacked on the second insulation layer 210 of the insulation layer structure 230 at an outside of the first opening 240.

Hereinafter, the first conductive pattern 255, the first barrier pattern 265, the second conductive pattern 275, the first mask 285, the first etch stop pattern 365 and the first capping pattern 385 sequentially stacked may be referred to as a bit line structure 395. In example embodiments, the bit line structure 395 may extend in the second direction D2 on the substrate 100, and a plurality of bit line structures 395 may be spaced apart from each other in the first direction D1, as illustrated in FIG. 13.

Figure 15:
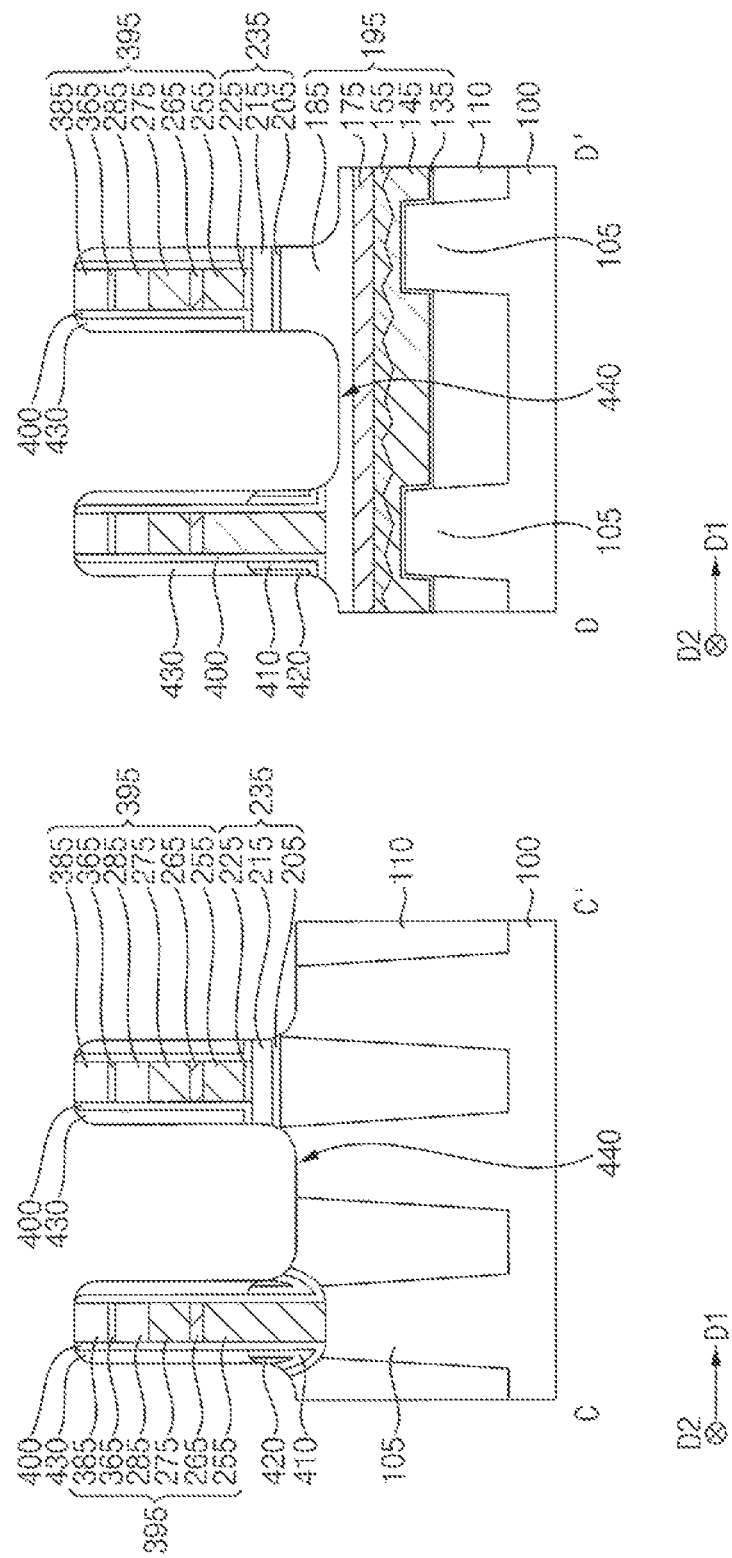

Referring to FIG. 15, a first spacer layer may be formed on the substrate 100 having the bit line structure 395 thereon, and a fourth insulation layer and a fifth insulation layer may be sequentially formed on the first spacer layer.

The first spacer layer may also cover a sidewall of the third insulation pattern 225 and a sidewall of the bit line structure 395, and the fifth insulation layer may fill a remaining portion of the first opening 240.

The first spacer layer may include a nitride, e.g., silicon nitride, the fourth insulation layer may include an oxide, e.g., silicon oxide, and the fifth insulation layer may include a nitride, e.g., silicon nitride.

The fourth and fifth insulation layers may be etched by an etching process. In example embodiments, the etching process may be performed by a wet etching process using phosphoric acid, SC1 and hydrofluoric acid as an etching solution, and other portions of the fourth and fifth insulation layers except for portions of the fourth and fifth insulation layers in the first opening 240 may be removed. Thus, most portions of a surface of the first spacer layer, that is, other portions of the first spacer layer except for the portion thereof in the first opening 240 may be exposed, and the portions of the fourth and fifth insulation layers remaining in the first opening 240 may form a fourth insulation pattern 410 and a fifth insulation pattern 420, respectively.

A second spacer layer may be formed on the exposed surface of the first pacer layer and on the fourth and fifth insulation patterns 410 and 420 in the first opening 240, and may be anisotropically etched to form a second spacer 430 on the surface of the first spacer 400 and the fourth and fifth insulation patterns 410 and 420 to cover a sidewall of the bit line structure 395. The second spacer layer may include an oxide, e.g., silicon oxide.

A dry etching process may be performed using the first capping pattern 385 and the second spacer 430 as an etching mask to form a second opening 440 exposing an upper surface of the active pattern 105, and upper surfaces of the isolation pattern 110 and the gate mask 185 may also be exposed by the second opening 440.

By the dry etching process, a portion of the first spacer layer on the upper surfaces of the first capping pattern 385 and the second insulation layer 210 may be removed, and thus a first spacer 400 may be formed to cover the sidewall of the bit line structure 395. Additionally, during the dry etching process, the first, second, and third insulation layers 200, 210, and 220 may be partially removed, and first, second, and third insulation patterns 205, 215, and 225 may remain under the bit line structure 395. The first to third insulation patterns 205, 215 and 225 sequentially stacked under the bit line structure 395 may form an insulation pattern structure.

Figure 16:
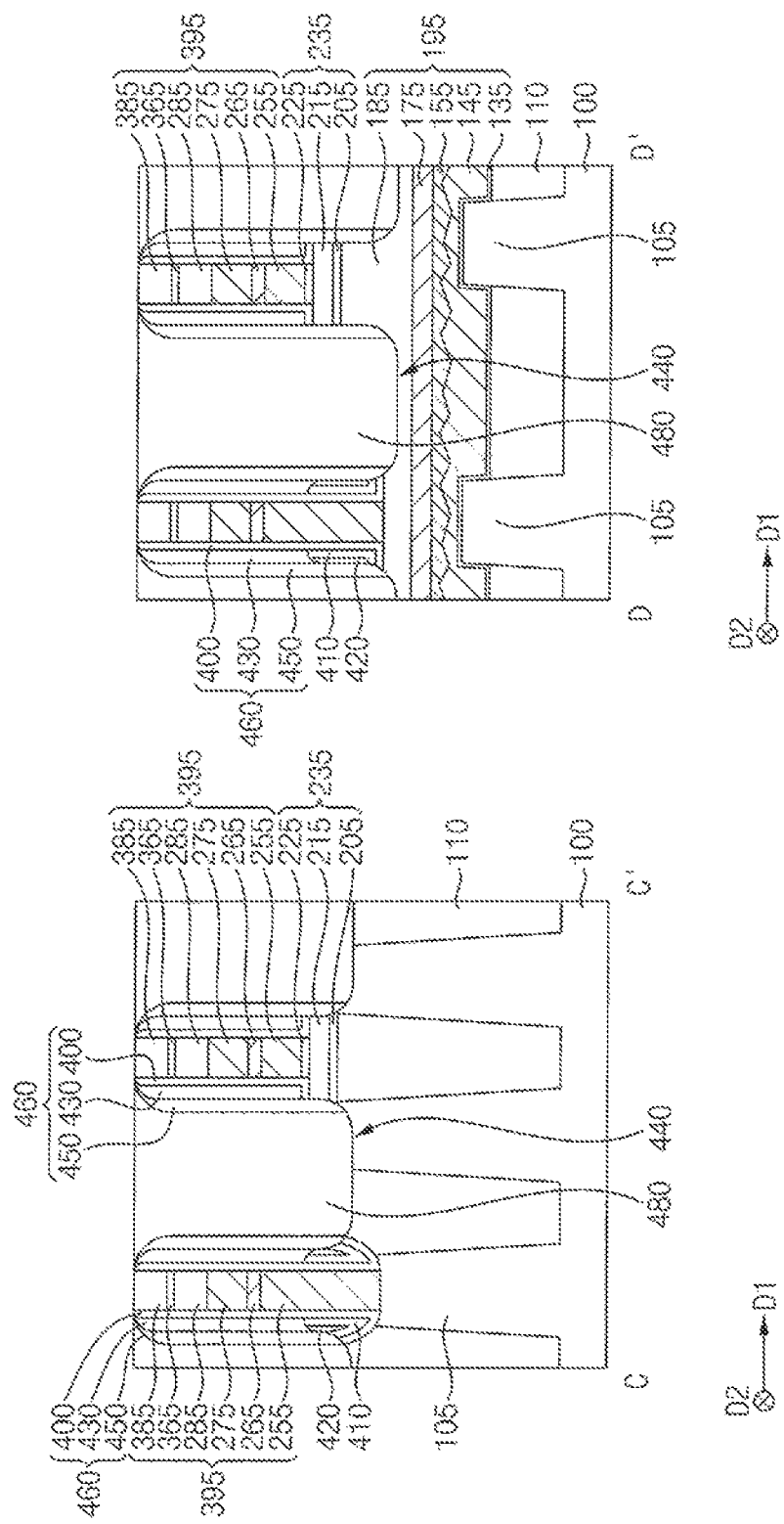

Referring to FIG. 16, a third spacer layer may be formed on the upper surface of the first capping pattern 385, an outer sidewall of the second spacer 430, portions of the upper surfaces of the fourth and fifth insulation patterns 410 and 420, and upper surfaces of the active pattern 105, the isolation pattern 110 and the gate mask 185 exposed by the second opening 440, and may be anisotropically etched to form a third spacer 450 covering the sidewall of the bit line structure 395. The third spacer layer may include a nitride, e.g., silicon nitride.

The first to third spacers 400, 430 and 450 sequentially stacked on the sidewall of the bit line structure 395 in a horizontal direction substantially parallel to the upper surface of the substrate 100 may be referred to as a preliminary spacer structure 460.

A second capping pattern 480 may be formed on the substrate 100 to fill the second opening 440, and may be planarized until the upper surface of the first capping pattern 385 is exposed. In example embodiments, the second capping pattern 480 may extend in the second direction D2, and a plurality of second capping patterns 480 may be spaced apart from each other in the first direction D1. The second capping pattern 480 may include a nitride, e.g., silicon nitride.

Figure 17:
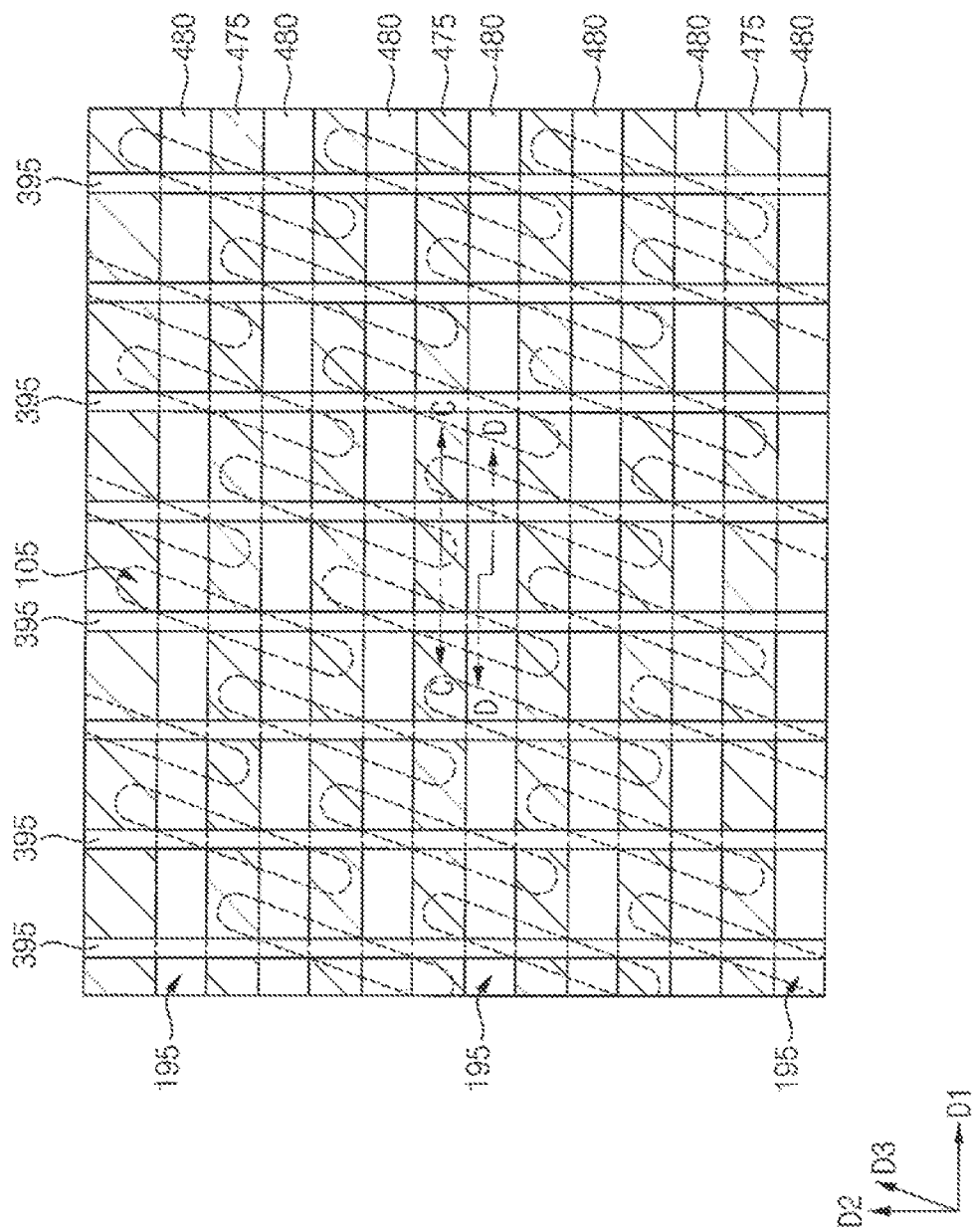
Figure 18:
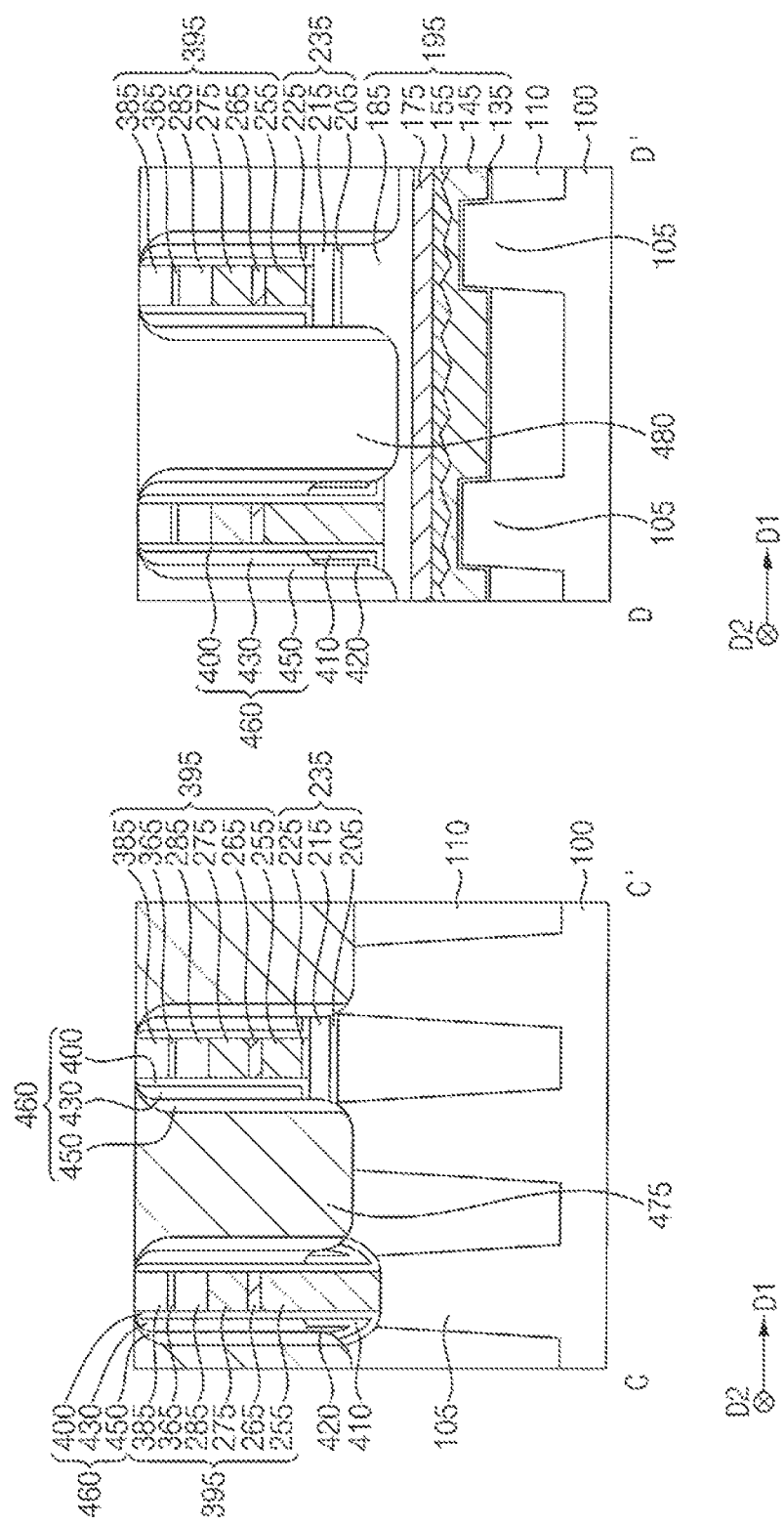

Referring to FIGS. 17 and 18, a second mask (not shown) having a plurality of third openings spaced apart from each other in the second direction D2, each of which may extend in the first direction D1, may be formed on the first and second capping patterns 385 and 480, and the second capping pattern 480 may be etched using the second mask as an etching mask.

In example embodiments, each of the third openings of the second mask (not shown) may overlap the gate structure 195 in the vertical direction. By the etching process, a fourth opening exposing an upper surface of the gate mask 185 of the gate structure 195 may be formed between the bit line structures 395.

After removing the second mask, a lower contact plug layer may be formed to fill the fourth opening, and may be planarized until the upper surfaces of the first and second capping patterns 385 and 480 are exposed. Thus, the lower contact plug layer may be divided into a plurality of lower contact plugs 475 spaced apart from each other in the second direction D2, each of which may extend in the first direction D1 between the bit line structures 395. Additionally, the second capping pattern 480 extending in the second direction D2 between the bit line structures 395 may be divided into a plurality of parts spaced apart from each other in the second direction D2 by the lower contact plugs 475.

The lower contact plug layer may include, e.g., doped polysilicon.

Figure 19:
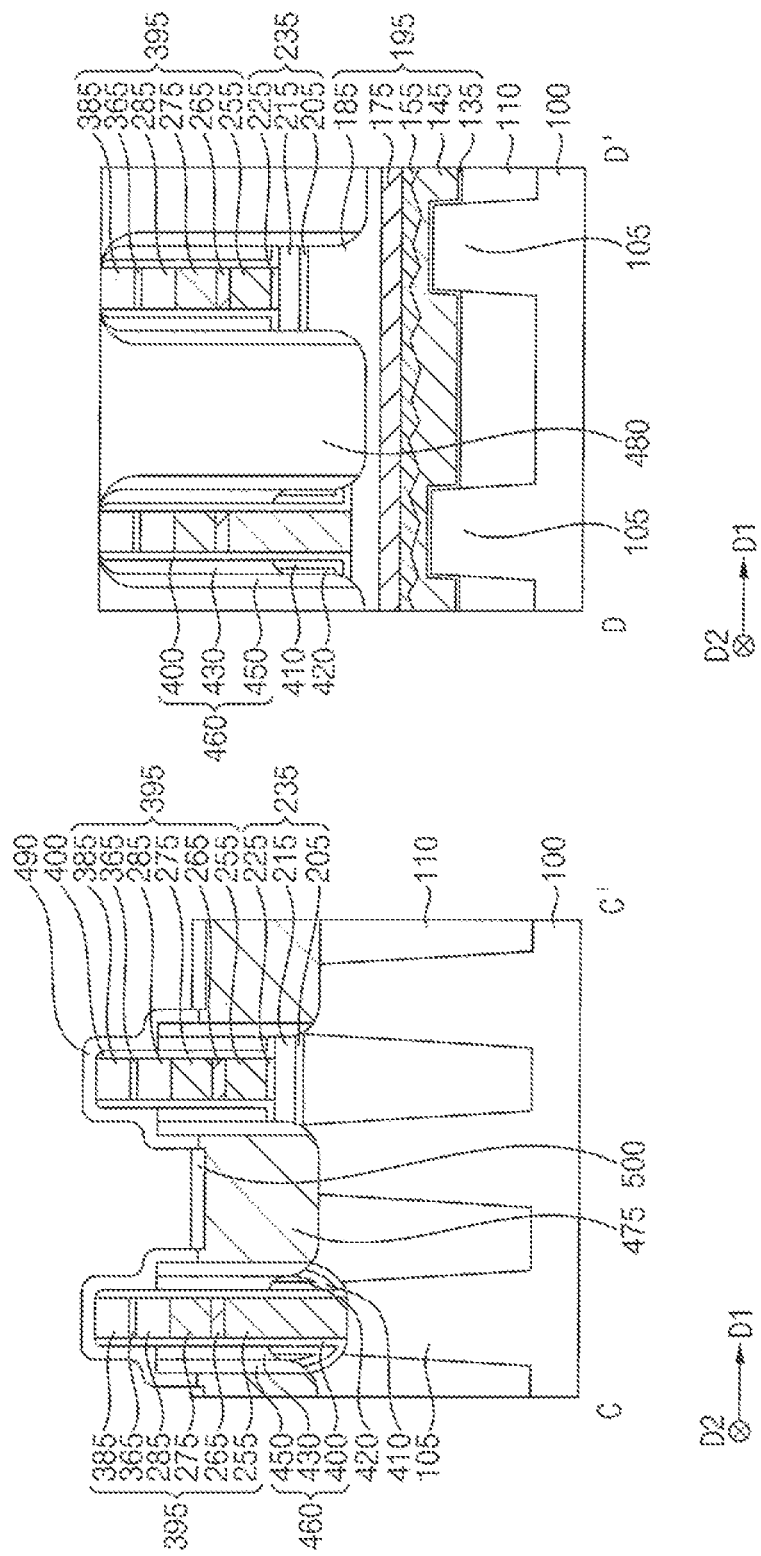

Referring to FIG. 19, an upper portion of the lower contact plug 475 may be removed to expose an upper portion of the preliminary spacer structure 460 on the sidewall of the bit line structure 395, and upper portions of the second and third spacers 430 and 450 of the exposed preliminary spacer structure 460 may be removed.

An upper portion of the lower contact plug 475 may be further removed. Thus, an upper surface of the lower contact plug 475 may be lower than uppermost surfaces of the second and third spacers 430 and 450. In some example embodiments, the upper surface of the lower contact plug 475 may be lower than an uppermost surface of the bit line structure 395.

A fourth spacer layer may be formed on the bit line structure 395, the preliminary spacer structure 460, the second capping pattern 480 and the lower contact plug 475, and may be anisotropically etched to form a fourth spacer 490 covering an upper portion of the preliminary spacer structure 460 on each of opposite sidewalls in the first direction D1 of the bit line structure 395, and thus an upper surface of the lower contact plug 475 may be exposed.

A metal silicide pattern 500 may be formed on the exposed upper surface of the lower contact plug 475. In example embodiments, the metal silicide pattern 500 may be formed by forming a first metal layer on the first and second capping patterns 385 and 480, the fourth spacer 490, and the lower contact plug 475, performing a heat treatment on the first metal layer, and removing an unreacted portion of the first metal layer. The metal silicide pattern 500 may include, e.g., cobalt silicide, nickel silicide, titanium silicide, etc.

Figure 20:
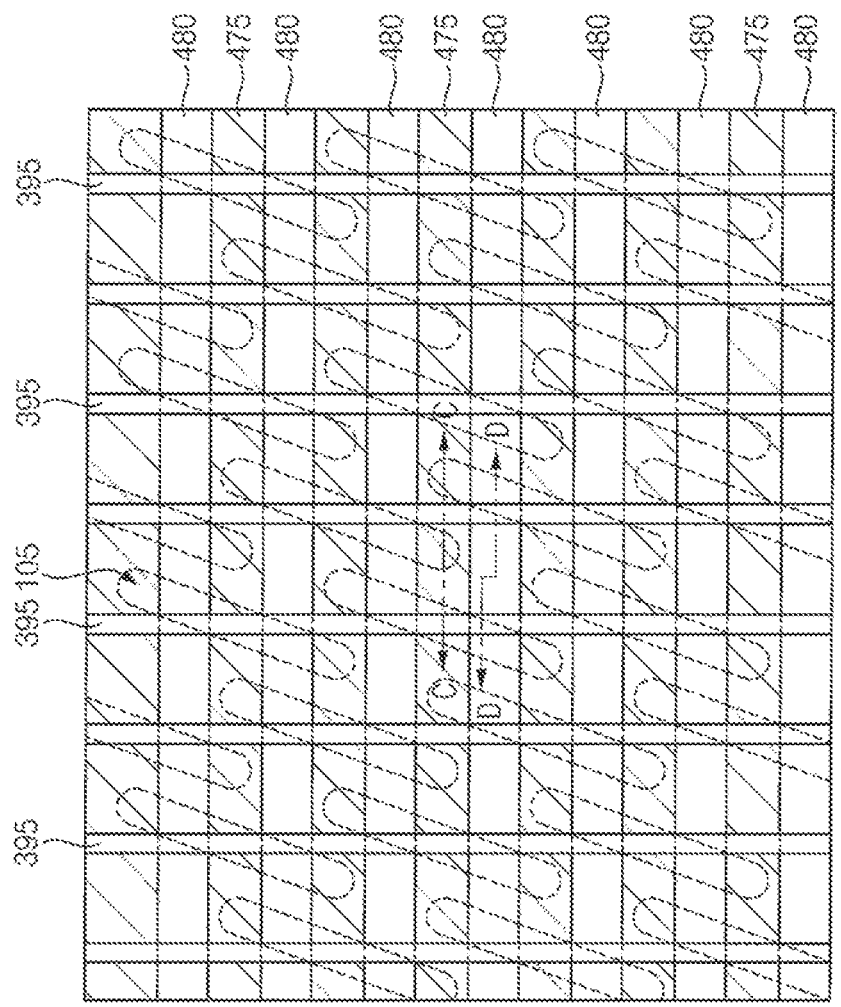
Figure 21:
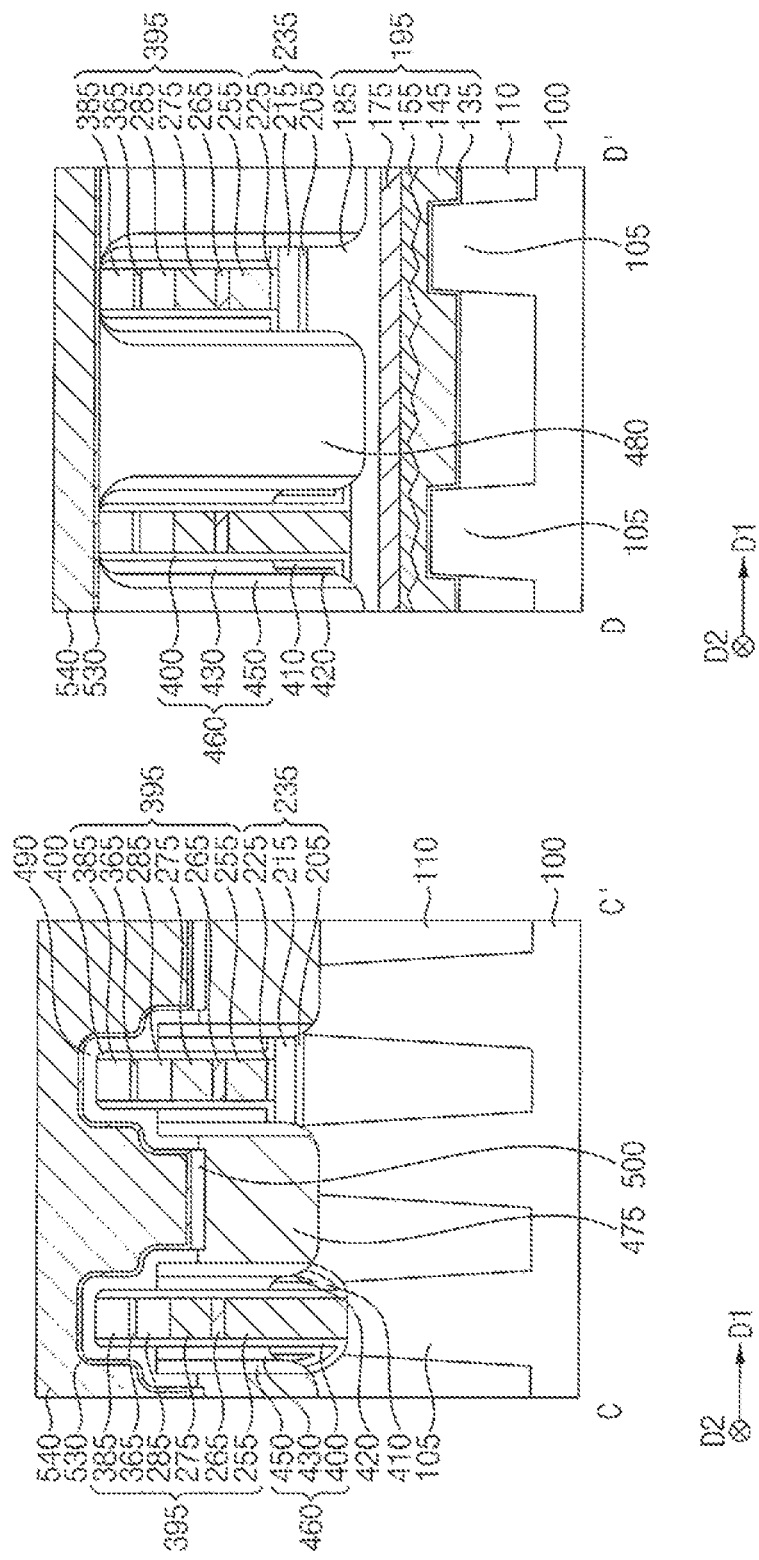

Referring to FIGS. 20 and 21, a second barrier layer 530 may be formed on the first and second capping patterns 385 and 480, the fourth spacer 490, the metal silicide pattern 500 and the lower contact plug 475 on the substrate 100, and a second metal layer 540 may be formed on the second barrier layer 530 to fill a space between the bit line structures 395.

A planarization process may be performed on an upper portion of the second metal layer 540. The planarization process may include a CMP process and/or an etch back process.

Figure 23:
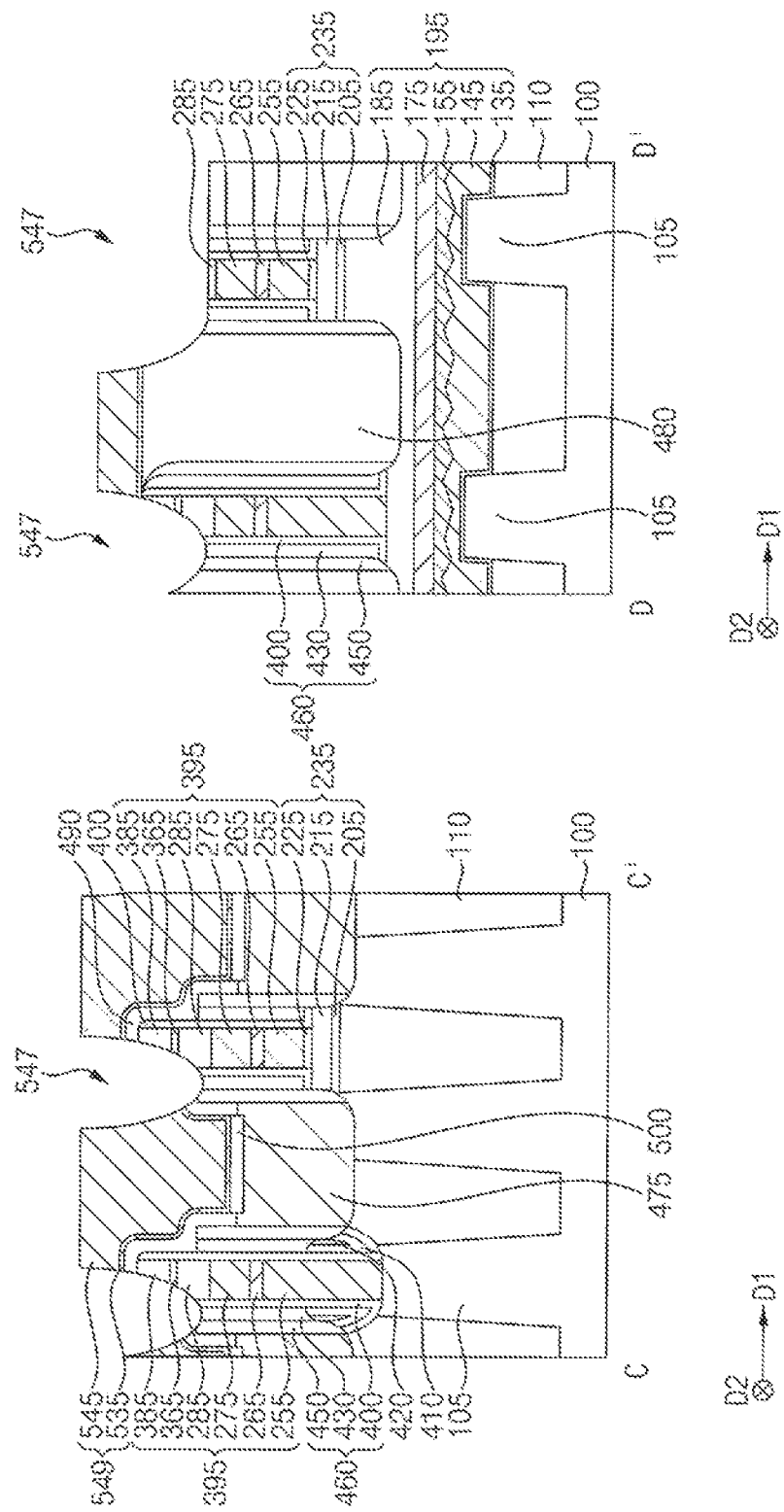

Referring to FIGS. 22 and 23, the second metal layer 540 and the second barrier layer 530 may be patterned to form an upper contact plug 549, and a fifth opening 547 may be formed between the upper contact plugs 549.

The fifth opening 547 may be formed by partially removing not only the second metal layer 540 and the second barrier layer 530, but also the first and second capping patterns 385 and 480, the fourth spacer 490, the first etch stop pattern 365 and the first mask 285, and thus an upper surface of the second spacer 430 may be exposed.

As the fifth opening 547 is formed, the second metal layer 540 and the second barrier layer 530 may be transformed into a second metal pattern 545 and a second barrier pattern 535, respectively, covering a lower surface and a sidewall of the second metal pattern 545, which may form an upper contact plug 549. In example embodiments, a plurality of upper contact plugs 549 may be spaced apart from each other in the first and second directions D1 and D2, and may be arranged in a honeycomb pattern in a plan view. Each of the upper contact plugs 549 may have a shape of a circle, ellipse, or polygon when viewed in plan view.

The lower contact plug 475, the metal silicide pattern 500 and the upper contact plug 549 sequentially stacked on the substrate 100 may form a contact plug structure.

Figure 24:
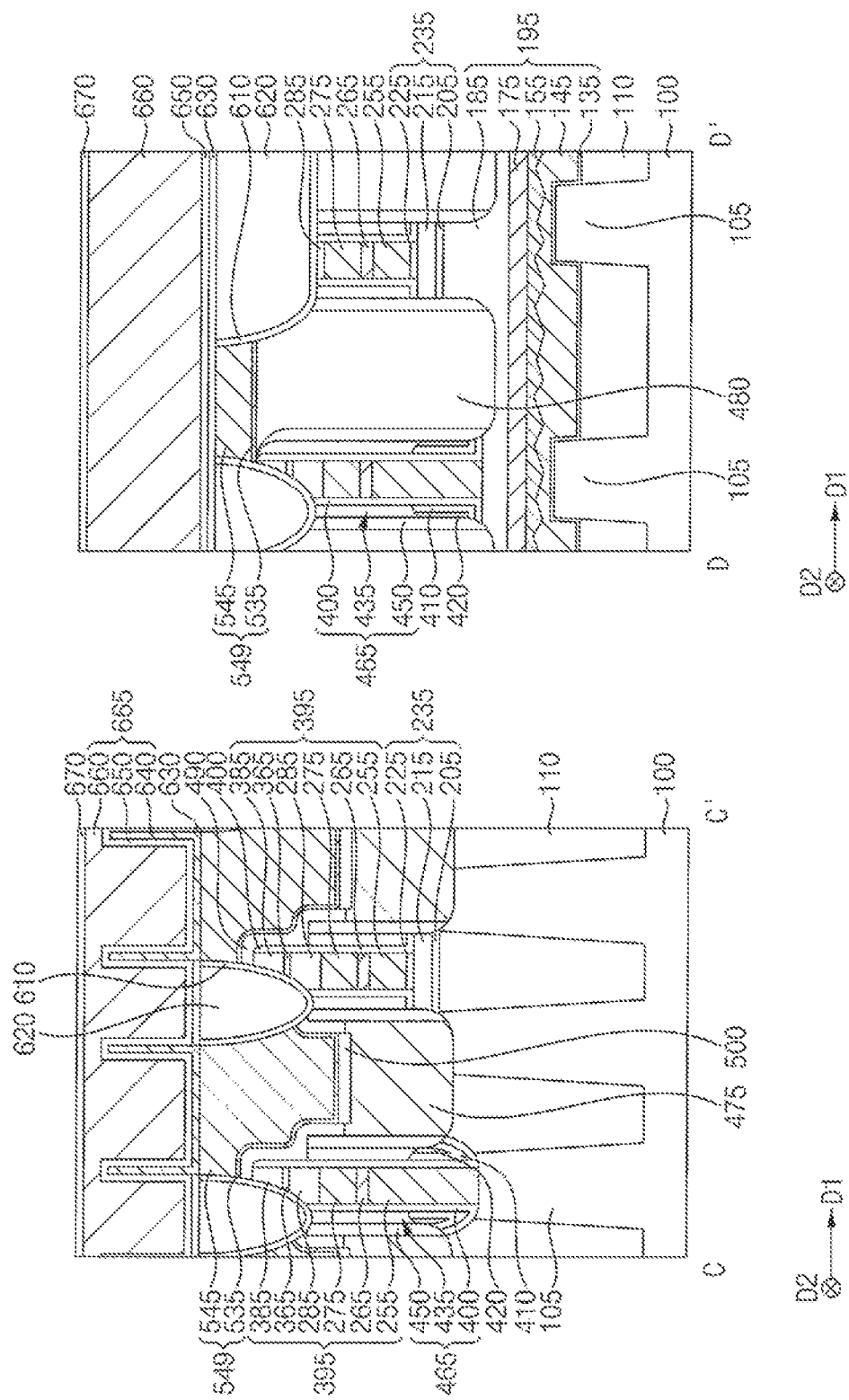

Referring to FIG. 24, the exposed second spacer 430 may be removed to form an air gap 435 connected with the fifth opening 547. The second spacer 430 may be removed by, e.g., a wet etching process.

In example embodiments, in the second spacer 430 on the sidewall of the bit line structure 395 extending in the second direction D2, not only a portion of the second spacer 430 directly exposed by the fifth opening 547 but also a portion thereof parallel to the above portion may be removed. That is, not only a portion of the second spacer 430 exposed by the fifth opening 547 not to be covered by the upper contact plug 549 but also a portion of the second spacer 430 covered by the upper contact plug 549 may be removed.

An insulating interlayer may be formed to fill the fifth opening 547.

In example embodiments, the insulating interlayer may include a sixth insulation layer 610 and a seventh insulation layer 620. The sixth insulation layer 610 may include an insulating material having a low gap-filling characteristic, and thus the air gap 435 under the fifth opening 547 may not be filled. The air gap 435 may be referred to as an air spacer 435, and the first and third spacers 400 and 450 and the air spacer 435 may form a spacer structure 465. The air gap 435 may be a spacer including air. The seventh insulation layer 620 may include an oxide, e.g., silicon oxide or a nitride, e.g., silicon nitride.

A capacitor 665 may be formed to contact an upper surface of the upper contact plug 549.

Particularly, a second etch stop layer 630 and a mold layer (not shown) may be sequentially formed on the upper contact plug 549 and the insulating interlayer, and may be partially etched to form a sixth opening partially exposing an upper surface of the upper contact plug 549. A second etch stop layer 630 may include a nitride, e.g., silicon nitride.

A lower electrode layer (not shown) may be formed on a sidewall of the sixth opening, the exposed upper surface of the upper contact plug 549 and the mold layer, a sacrificial layer (not shown) may be formed on the lower electrode layer to fill the sixth opening, and the lower electrode layer and the sacrificial layer may be planarized until an upper surface of the mold layer is exposed to divide the lower electrode layer. The sacrificial layer and the mold layer may be removed by, e.g., a wet etching process, and thus a cylindrical lower electrode 640 may be formed on the exposed upper surface of the upper contact plug 549. Alternatively, a pillar shaped lower electrode 640 entirely filling the sixth opening may be formed. The lower electrode 640 may include a metal, a metal nitride, a metal silicide, doped polysilicon, etc.

A dielectric layer 650 may be formed on a surface of the lower electrode 640 and the second etch stop layer 630, an upper electrode 660 may be formed on the dielectric layer 650 to form the capacitor 665 include the lower electrode 640, the dielectric layer 650 and the upper electrode 660.

The dielectric layer 650 may include, e.g., a metal oxide, the upper electrode 660 may include, e.g., a metal, a metal nitride, a metal silicide, doped polysilicon, etc.

The semiconductor device manufactured by the above processes may include the gate structure 195 that may include the first gate electrode 145, the first gate barrier pattern 155 and the second gate electrode 175 sequentially stacked, and the metal of the first gate electrode 145 and the metal nitride of the second gate electrode 175 may not be diffused due to the first gate barrier pattern 155. Thus, the semiconductor device may have enhanced electrical characteristics. The semiconductor device may have following structural characteristics.

In example embodiments, the semiconductor device may include the active pattern 105 on the substrate 100, the isolation pattern 110 covering a sidewall of the active pattern 105, the gate structure 195 extending in the first direction D1 and being buried in upper portions of the active pattern 105 and the isolation pattern 110, the bit line structure 395 contacting a central upper surface of the active pattern 105 and extending in the second direction D2, the contact plug structure contacting an upper surface of each of opposite ends of the active pattern 105 and including the lower contact plug 475, the metal silicide pattern 500 and the upper contact plug 549 sequentially stacked, and the capacitor 665 on the contact plug structure.

In example embodiments, the active pattern 105 may extend in the third direction D3, and a plurality of active patterns 105 may be spaced apart from each other in the first and second directions D1 and D2. Additionally, a plurality of gate structures 195 may be spaced apart from each other in the second direction D2, and a plurality of bit line structures 395 may be spaced apart from each other in the first direction D1.

FIG. 25 is a cross-sectional view illustrating a semiconductor device in accordance with example embodiments. The semiconductor device may be substantially the same as or similar to that of FIG. 24, except for some elements. Thus, like reference numerals refer to like elements, and repeated explanations thereon are omitted herein for conciseness.

The semiconductor device illustrated in FIG. 25 is the application of the gate structure illustrated with reference to FIG. 9 to a DRAM device.

Referring to FIG. 25, the gate structure 195 of the semiconductor device may include the gate barrier pattern structure 165, and the diffusion of the metal of the first gate electrode 145 and the metal nitride of the second gate electrode 175 may be prevented. Thus, the semiconductor device may have the enhanced electrical characteristics.

While various example embodiments have been shown and described with reference to the figures, it will be understood by those of ordinary skill in the art that various changes in form and details may be made thereto without departing from the spirit and scope of the disclosure as set forth by the following claims.

What is claimed is:

1. A gate structure comprising:
a first gate electrode including a first metal;
a gate barrier pattern structure on the first gate electrode, the gate barrier pattern structure including a first gate barrier pattern including a first material and a second gate barrier pattern including a second material different from the first material; and
a second gate electrode on the gate barrier pattern structure,
wherein the second gate barrier pattern is formed between the first gate barrier pattern and the second gate electrode, and
wherein the gate structure is buried in a trench in an active area of a substrate.

2. The gate structure according to claim 1, wherein the gate barrier pattern structure includes a second metal different from the first metal.

3. The gate structure according to claim 1, wherein the first gate electrode includes tungsten, molybdenum, tantalum or titanium, and
wherein the gate barrier pattern structure includes tungsten nitride, molybdenum nitride, tantalum nitride or titanium nitride.

4. The gate structure according to claim 1, wherein the second gate electrode includes doped polysilicon.

5. The gate structure according to claim 1, further comprising:
a gate mask on the second gate electrode; and
a gate insulation pattern on a lower surface and a sidewall of the first gate electrode, and on a sidewall of each of the second gate electrode, the gate mask, and the gate barrier pattern structure.

6. A gate structure comprising:
a first gate electrode;
a gate barrier pattern structure on the first gate electrode, the gate barrier pattern structure including a first gate barrier pattern including a first material and a second gate barrier pattern including a second material different from the first material; and
a second gate electrode on the gate barrier pattern structure,
wherein the gate structure is buried in a trench in an active area of a substrate, and
wherein the gate barrier pattern structure has a flat upper surface and an uneven lower surface.

7. The gate structure according to claim 6, wherein an upper surface of the second gate barrier pattern and a lower surface of the first gate barrier pattern are not flat.

8. The gate structure according to claim 7, wherein a lower surface of the second gate barrier pattern is not flat.

9. The gate structure according to claim 6, wherein a thickness of the first gate barrier pattern is not uniform.

10. The gate structure according to claim 6, wherein:
the first gate electrode includes a metal,
the second gate barrier pattern includes a metal oxynitride, and
the first gate barrier pattern includes a metal nitride.

11. The gate structure according to claim 10, wherein each of the first gate barrier pattern and the second gate barrier pattern includes a same metal that is different from the metal included in the first gate electrode.

12. The gate structure according to claim 6, wherein the second gate electrode includes doped polysilicon.

13. The gate structure according to claim 6, further comprising:
- a gate mask on the second gate electrode; and
- a gate insulation pattern on a lower surface and a sidewall of the first gate electrode, and a sidewall of each of the gate barrier pattern structure, the second gate electrode and the gate mask.

14. A semiconductor device comprising:
- an active pattern on a substrate;
- an isolation pattern covering a sidewall of the active pattern;
- a gate structure buried in upper portions of the active pattern and the isolation pattern, the gate structure extending in a first direction parallel to an upper surface of the substrate;
- a bit line structure contacting a central upper surface of the active pattern and extending in a second direction parallel to the upper surface of the substrate and perpendicular to the first direction;
- a contact plug structure contacting an upper surface of each of opposite ends of the active pattern; and
- a capacitor on the contact plug structure,
- wherein the gate structure includes:
- a first gate electrode extending in the first direction and including a metal;
- a gate barrier pattern structure on the first gate electrode, the gate barrier pattern structure including a metal nitride; and
- a second gate electrode on the gate barrier pattern structure, and
- wherein the gate barrier pattern structure has a flat upper surface and an uneven lower surface.

15. The semiconductor device according to claim 14, wherein the active pattern extends in a third direction parallel to the upper surface of the substrate and having an acute angle with respect to the first direction and the second direction, and the active pattern is one of a plurality of active patterns spaced apart from each other in the first direction and the second direction, and
- wherein the gate structure is one of a plurality of gate structures spaced apart from each other in the second direction, and the bit line structure is one of a plurality of bit line structures spaced apart from each other in the first direction.

16. The semiconductor device according to claim 14, wherein the gate barrier pattern structure includes a second gate barrier pattern and a first gate barrier pattern stacked on the first gate electrode, and
- the first gate barrier pattern includes a first material and the second gate barrier pattern includes a second material different from the first material.

17. The semiconductor device according to claim 16, wherein an upper surface of the second gate barrier pattern and a lower surface of the first gate barrier pattern are not flat.

18. The semiconductor device according to claim 16, wherein a thickness of the first gate barrier pattern is not uniform.

19. The semiconductor device according to claim 14, wherein the first gate electrode and the gate barrier pattern structure include different metals from each other.

20. The semiconductor device according to claim 14, wherein the second gate electrode includes doped polysilicon.

* * * * *